US008316068B2

(12) United States Patent
Dent

(10) Patent No.: US 8,316,068 B2
(45) Date of Patent: Nov. 20, 2012

(54) MEMORY COMPRESSION

(75) Inventor: Paul Wilkinson Dent, Pittsboro, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 2320 days.

(21) Appl. No.: 11/143,157

(22) Filed: Jun. 2, 2005

(65) Prior Publication Data
US 2006/0010296 A1    Jan. 12, 2006

Related U.S. Application Data

(60) Provisional application No. 60/577,386, filed on Jun. 4, 2004.

(51) Int. Cl.
G06F 15/00 (2006.01)
G06F 1/02 (2006.01)

(52) U.S. Cl. .................................. 708/203; 708/272

(58) Field of Classification Search .......... 708/200–209, 708/272
See application file for complete search history.

(56) References Cited

U.S. PATENT DOCUMENTS

| 4,503,510 A * | 3/1985 | Weaver | 708/203 |
| 5,048,059 A | 9/1991 | Dent | |
| 5,070,303 A | 12/1991 | Dent | |
| 5,148,373 A | 9/1992 | Dent | |
| 5,793,371 A * | 8/1998 | Deering | 708/203 |
| 5,838,597 A * | 11/1998 | Pau et al. | 708/203 |
| 5,867,167 A * | 2/1999 | Deering | 708/203 |
| 5,944,774 A | 8/1999 | Dent | |
| 6,711,596 B1 | 3/2004 | Coleman | |
| 2002/0116424 A1* | 8/2002 | Radermacher et al. | 708/203 |
| 2004/0015358 A1* | 1/2004 | Reynolds | 704/256 |
| 2004/0249623 A1* | 12/2004 | Selvidge et al. | 703/23 |

FOREIGN PATENT DOCUMENTS
WO     WO 02/056297     7/2002

OTHER PUBLICATIONS

Smith, S.W., "The Scientist and Engineer's Guide to Digital Signal Processing," 1999, pp. 481-502, California Technical Publishing, San Diego, XP002354581.

Rohrs, C., "Improving LimeWire's Performance," Nov. 24, 2002, p. 1, XP002354579.

(Continued)

Primary Examiner — Chuong D Ngo
(74) Attorney, Agent, or Firm — Coats & Bennett, P.L.L.C.

(57) ABSTRACT

Exemplary embodiments of the present invention comprise a method for compressing data for storage in memory. According to one embodiment, the method forms a set of values based on a monotonically ordered series of look-up table values. For one or more paired values in the set, the exemplary method generates a difference of the values in the pair. After replacing one of the values in the pair with a value based on the differences to modify the set, the exemplary method stores final values based on the modified set in memory. The present invention also comprises memory for storing the look-up table values. One exemplary memory comprises a decoder, an encoder, and one or more patterns of crisscrossed interconnect lines that interconnect the encoder with the decoder. The patterns of crisscrossed interconnection lines may be implemented on one or more planar layers of conductor tracks vertically interleaved with isolating material.

37 Claims, 14 Drawing Sheets

OTHER PUBLICATIONS

Coleman, J.N. et al., "Arithmetic on the European Logarithmic Microprocessor," IEEE Transactions on Computers, Jul. 2000, pp. 702-715, vol. 49, No. 7.

Lewis, David, "Interleaved Memory Function Interpolators with Application to an Accurate LNS Arithmetic Unit," IEEE Transactions on Computers, Aug. 1994, pp. 974-982, vol. 43, No. 8.

Lewis, David, "An Architecture for Addition and Subtraction of Long Word Length Numbers in the Logarithmic Number System," IEEE Transactions on Computers, Nov. 1990, pp. 1325-1336, vol. 39, No. 11.

Kingsbury, N.G. et al., "Digital Filtering Using Logarithmic Arithmetic," Electronic Letters, Jan. 28, 1971, vol. 7, No. 1.

* cited by examiner

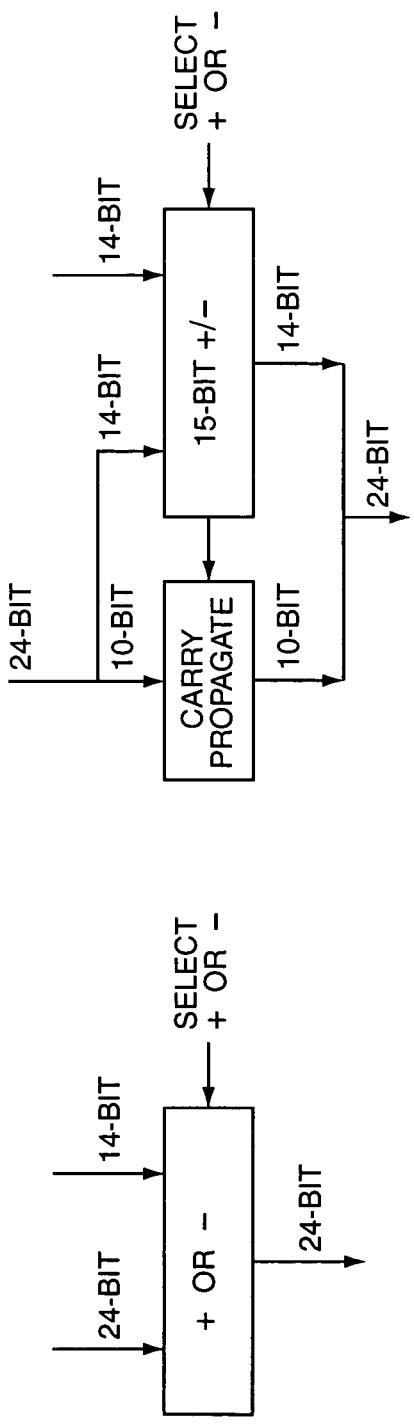
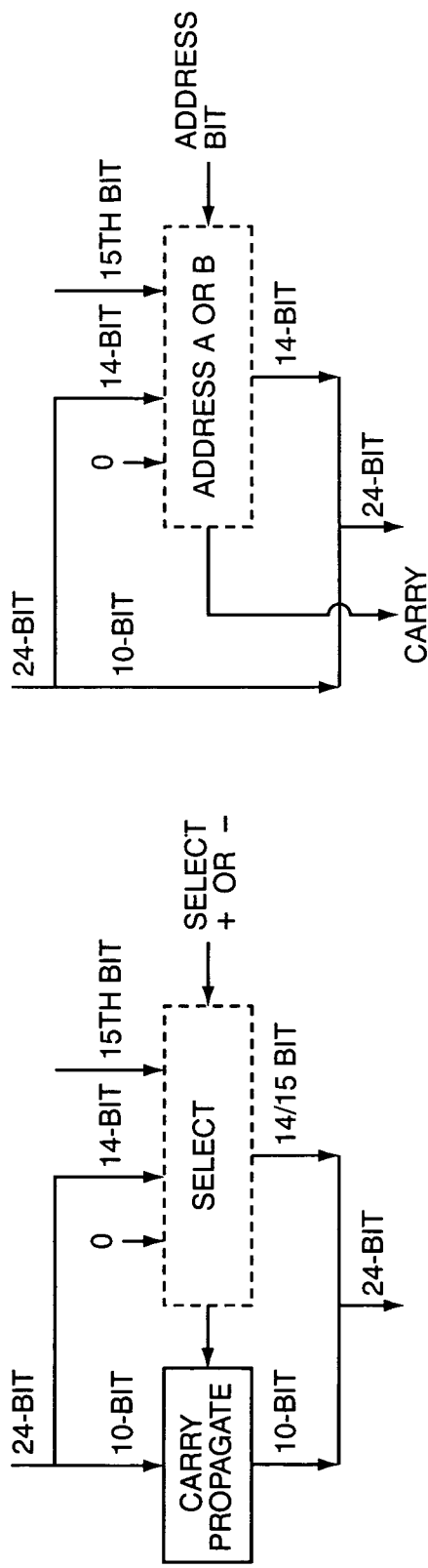
FIG. 6A
FIG. 6B
FIG. 6C
FIG. 6D

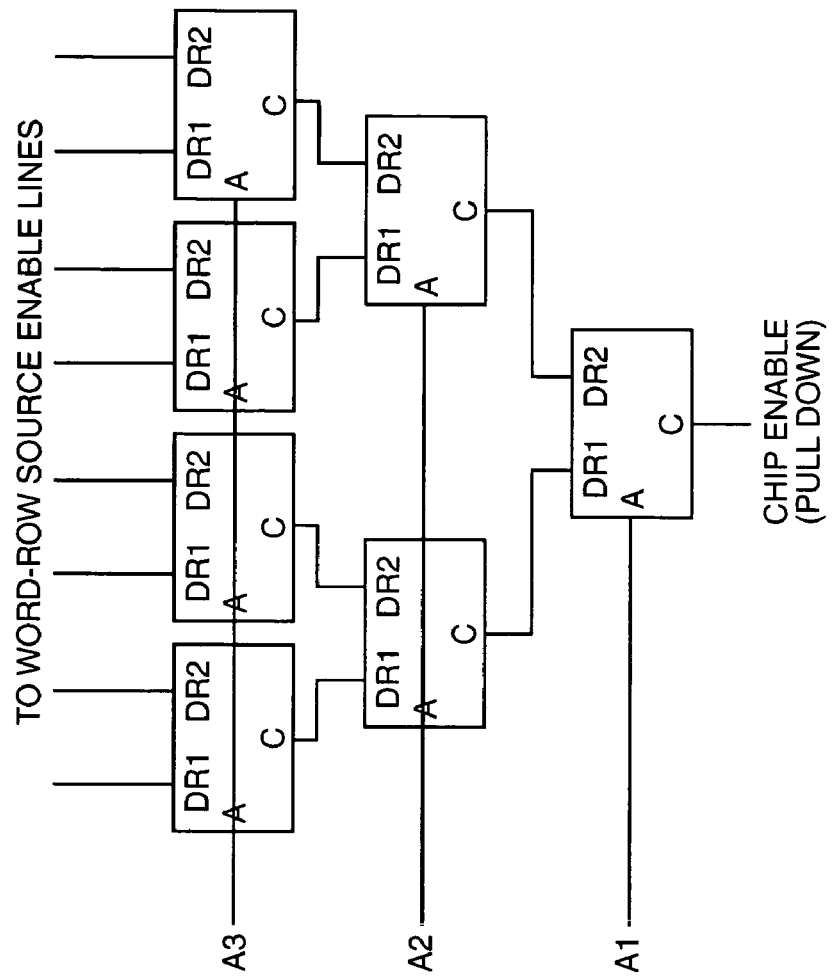
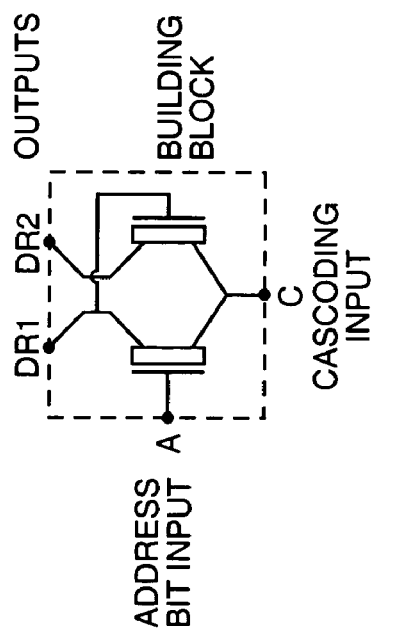
FIG. 9A
FIG. 9B

MEMORY COMPRESSION

This application claims priority to Provisional U.S. Patent Application 60/577,386 filed Jun. 4, 2004, which is incorporated herein by reference.

BACKGROUND

The invention enables size and cost reductions for low-cost electronic devices based on embedded microprocessors with memory requirements for fixed data such as look-up tables or programs.

Electronic devices often use microprocessors to perform a variety of tasks ranging from the very simple to the very complicated. When a device, such as a remote control device, a mobile device, etc., is designed for a specific function or functions, the programs corresponding to those functions are usually, once development is complete, stored in a Read Only Memory (ROM). Other fixed data may also be stored in ROM, such as a look-up table for values of some function required for computation, such as an exponential or logarithm function, or trigonometric functions.

A low cost and compact form of ROM is Mask Programmed ROM. In a Mask-Programmed ROM, the address is decoded to provide a logic level on one of a number of signal lines corresponding to the address. The address lines cross the bit lines corresponding to the desired output word, and a transistor is placed at the crossing of every address line and bit line where a binary "1" is the desired bit output for that address. Such a ROM is in fact equivalent to a gigantic OR-gate for each output bit, determining it to be a "1" if address A1.OR.A2.0R.A3 ... is active, else determining it to be a "0".

The transistors used to indicate a stored '1' provide the inputs to each multi-input OR gate. FIG. 1 shows such a ROM, wherein a word of length 32 bits is stored against each of 1024 addresses. Where a larger memory is desired, the pattern of FIG. 1 may be repeated to form successive rows of 1024 words, and row-select lines are provided to enable output from a selected row, which, together with activation of a particular column address line, selects a particular word.

The transistors are placed by means of a custom-designed diffusion and/or contact and/or metallization mask used during the fabrication process, adapted for the desired bit pattern. Since mask-making is expensive, this is used only when the ROM contents are expected to be fixed for high volumes of production units. Other forms of memory, such as Electronically or UV-erasable and Reprogrammable Read Only Memory (EAROM, EEROM, EPROM, "FLASH" memory, etc.) and other more recent non-volatile memory developments such as ferroelectric memory are therefore more usually selected in preference to Masked ROM because of the convenience that the memory may be manufactured before the desired contents are known and filled later, as well as modified in-service. It might be said that the silicon area and consequent cost advantage of Mask Programmed ROM have to date not been sufficient to outweigh the convenience of in-situ programming.

Some solutions that could give the advantages of Masked ROM while preserving some flexibility comprise storing mature sections of program, i.e., subroutines, or fixed tables for mathematical functions or character set displays in Masked ROM, but linking and invoking them by a smaller program in reprogrammable memory. That way, if a Masked-ROM routine needs to be replaced, the replacement routine only need be placed in reprogrammable memory and the Masked-ROM version bypassed, a process known as "patching". However, the area advantages of Masked ROM have still not been sufficient to encourage widespread use of this technique. Thus, there is a need for fixed-content memory that is significantly more compact and economic than Masked ROM has been hitherto.

SUMMARY

Exemplary embodiments of the present invention comprise a method for compressing data for storage in a memory. According to one embodiment, the method comprises forming a set of values based on a monotonically ordered series of look-up table values. For one or more paired values in the set, the exemplary method generates a difference of the values in the pair. After replacing one of the values in the pair with a value based on the differences to modify the set, the exemplary method stores final values based on the modified set in memory.

According to one embodiment, the remaining values in the modified pairs remain unaltered. After this first iteration, final values based on the modified set are stored in memory. Alternatively, additional iterations may be performed to further compress the data storage. For example, in a second iteration, the exemplary method forms pairs between the unmodified values and forms pairs between the modified values, and generates new differences of the values in the new pairs. Subsequently, the exemplary method modifies the current set by replacing one of the values in the pairs with a value based on the differences. This process repeats until the predetermined number of iterations has been completed. After completing the final iteration, final values based on the modified set of values produced by the final iteration are stored in memory.

According to another embodiment, the remaining values in the modified pairs are replaced with values generated based on the sum of the values in the pair. After this first iteration, concatenating the sum and difference of each pair generates the final values. Alternatively, additional iterations may be performed to further compress the data storage. For example, in a second iteration, the exemplary method forms pairs between the sum values and forms pairs between the difference values, and generates new sums differences of the values in each of the new pairs. This process repeats until the predetermined number of iterations has been completed. After completing the final iteration, concatenating the sums and differences corresponding to the pairings of the final iteration generates the final values.

In one embodiment, a ROM for storing a number $2^{N1}$ quantities of word length L1 is compressed from a total size of $L1 \times 2^{N1}$ bits to a ROM that stores $2^{N2}$ words of L2 bits, a total of $L2 \times 2^{N2}$ bits, where L2>L1 and N2<N1, by use of an inventive algorithm.

One application is for providing a look-up table for a regular function F(x) where the table is addressed by a binary bit pattern corresponding to x and outputs the value F pre-stored at that location. In this case, a first order compression replaces alternate values of the function with their delta values from the preceding address. Alternatively, each pair of adjacent values may be replaced by their sum, with the least significant bit (LSB) discarded, and their difference. When the function is regular, the difference between successive values is much smaller than the function value itself and therefore can be stored in fewer bits.

A $2^{nd}$ order algorithm can comprise repeating the compression procedure, taking as input the array of even-address values from the first stage, and separately the odd-address delta-value array, thereby obtaining a function value, two first order differences and a second order difference in replacement for four function values. The second order differences are usually even smaller than the first order differences, and therefore can be stored using even fewer bits than the first order differences, achieving further compression. A systematic procedure is disclosed for constructing compression algorithms of higher order using a Fast Walsh Transform based on a modified Butterfly operation in which the LSB of the sum term is discarded. Values are reconstructed using the inverse transform upon reading the ROM.

A second implementation stores blocks of numerically adjacent values by storing a common or nearly common most significant bit (MSB) pattern and different LSB patterns, thus reducing the average number of bits per value stored. It can allow more convenient block sizes, i.e., regular block sizes, if the common most significant bit patterns in a block are allowed to differ by up to + or −1. Extra bits associated with the least significant parts then determine if the common most significant part must be incremented or decremented for a particular retrieved value, or not. The second implementation allows simpler reconstruction than the first implementation.

The present invention also comprises memory for storing a plurality of look-up table values, where each look-up table value is associated with an address comprising a plurality of address symbols. One exemplary memory comprises a decoder, an encoder, and one or more patterns of crisscrossed interconnect lines. The decoder generates an enable signal for one of the decoder outputs by decoding one or more of the plurality of address symbols, while the encoder generates an output word based on the enable signal. The patterns of crisscrossed interconnect lines connect each of the decoder outputs to an encoder input. To reduce the size of the memory, some aspects of the present invention form the patterns of crisscrossed interconnection lines using one or more planar layers of conductor tracks vertically interleaved with isolating material to utilize the vertical dimension of the memory.

One exemplary use for this memory allows compressing memory size for storing values of an irregular function, or even storing random values, such as computer program instructions. In this case, the inventive algorithm operates on the function or data values in a sorted numerical order, which can be achieved by permuting address lines on the chip in a fixed pattern. The compression procedures described for regular functions can then be used to replace certain absolute data values with their deltas relative to the closest absolute data value stored anywhere, using fewer bits to store the deltas than to store absolute data values. Where two or more adjacent values are identical, they may be compressed to one, and the corresponding address lines merged using an OR gate input. Each OR gate input requires one transistor, and is thus equivalent to a memory bit in terms of silicon area occupied.

Reconstruction of an addressed value that has been compressed using an algorithm of order M comprises reading a word of length L2 bits whenever one of M adjacent address lines is activated. Then, its constituent parts comprising a base value, first order and higher differences are combined according to which of the address lines is active. Each group of M address lines may be combined using an M-line to $\log_2(M)$-line priority encoder to obtain $\log_2(M)$ bits for systematically enabling reconstructive combinatory logic.

Using the invention, ROM silicon area can be reduced typically by a factor between 2 and 5 depending on the order of the algorithm and the amount of reconstructive combinatorial logic used. Bit-exact reconstruction always occurs, as is of course required when the compressed data is a computer program.

In a second aspect of an exemplary memory implementation, compression of random ROM contents is achieved by sorting the data into numerical order by permuting address lines. Storing the same number of bits of information with fewer actual bit elements in the ROM than information bits is possible because information is effectively stored within the permutation pattern. Because it is possible to accommodate on a chip very many layers of interconnection patterns separated by insulating layers, a large number of different permutation patterns of address lines may be fabricated, each containing information, thereby utilizing the vertical dimension to store an increased amount of information.

BRIEF DESCRIPTION OF THE DRAWINGS

FIGS. 6A-6D illustrate one exemplary process for eliminating a first layer of a Butterfly circuit for reconstructing stored data.

FIGS. 9A and 9B illustrate one exemplary row address decoder.

DETAILED DESCRIPTION

Firstly, an exemplary application of the invention will be described in which a look-up table is required for values of a regular function, e.g., a monotonically increasing function, desired for a particular computation. Equation (1) represents the exemplary function as:

$$F_a(x)=\log_a(1+a^{-x}), \tag{1}$$

where "a" is the base of the logarithms. This function is encountered in logarithmic arithmetic as described in U.S. patent application Ser. No. 11/142,760, now U.S. Pat. No. 7,689,639, and Ser. No. 11/142,485, now U.S, Pat. No. 7,711, 764, both of which were filed 1 Jun. 2005, and both of which are incorporated herein by reference.

Figure 1:
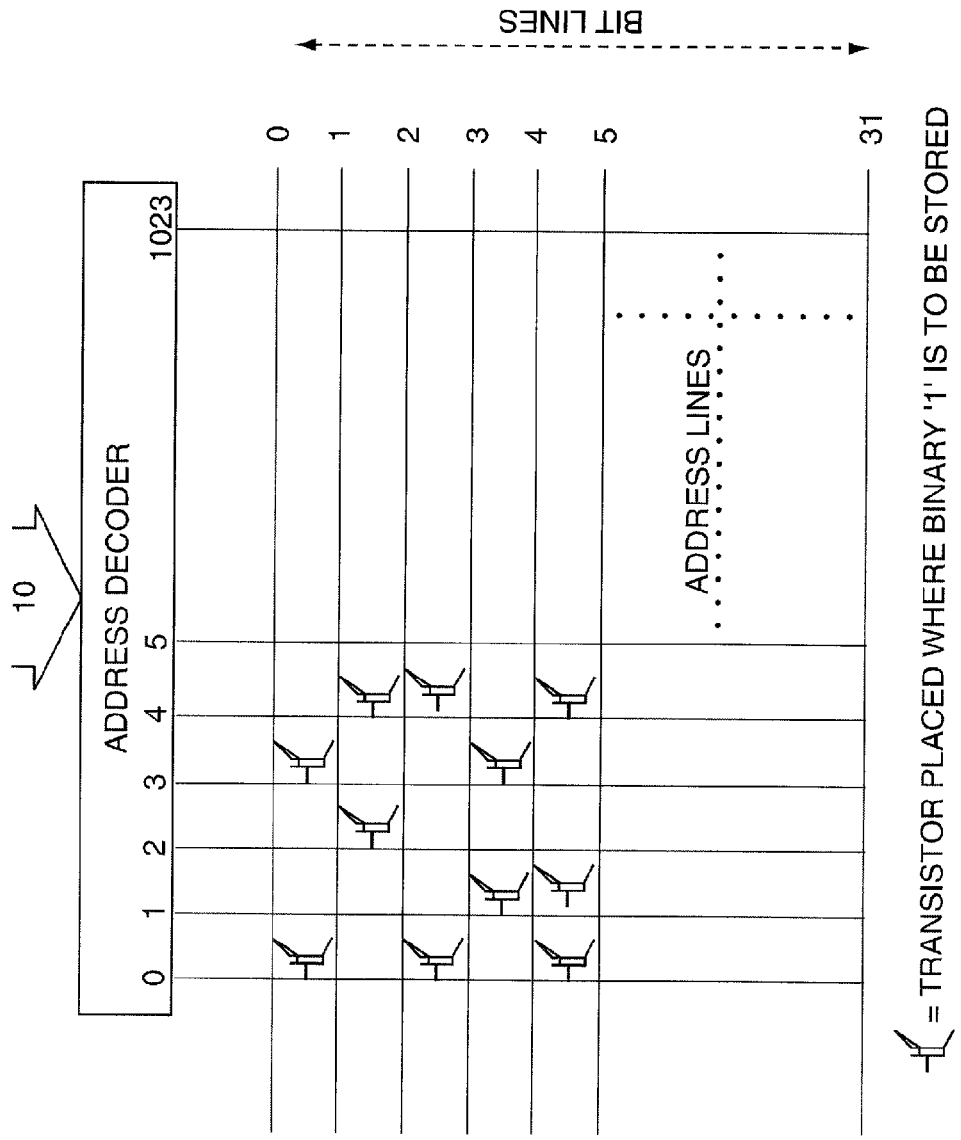
FIG. 1 illustrates a mask programmed Read Only Memory (ROM).
Figure 2:
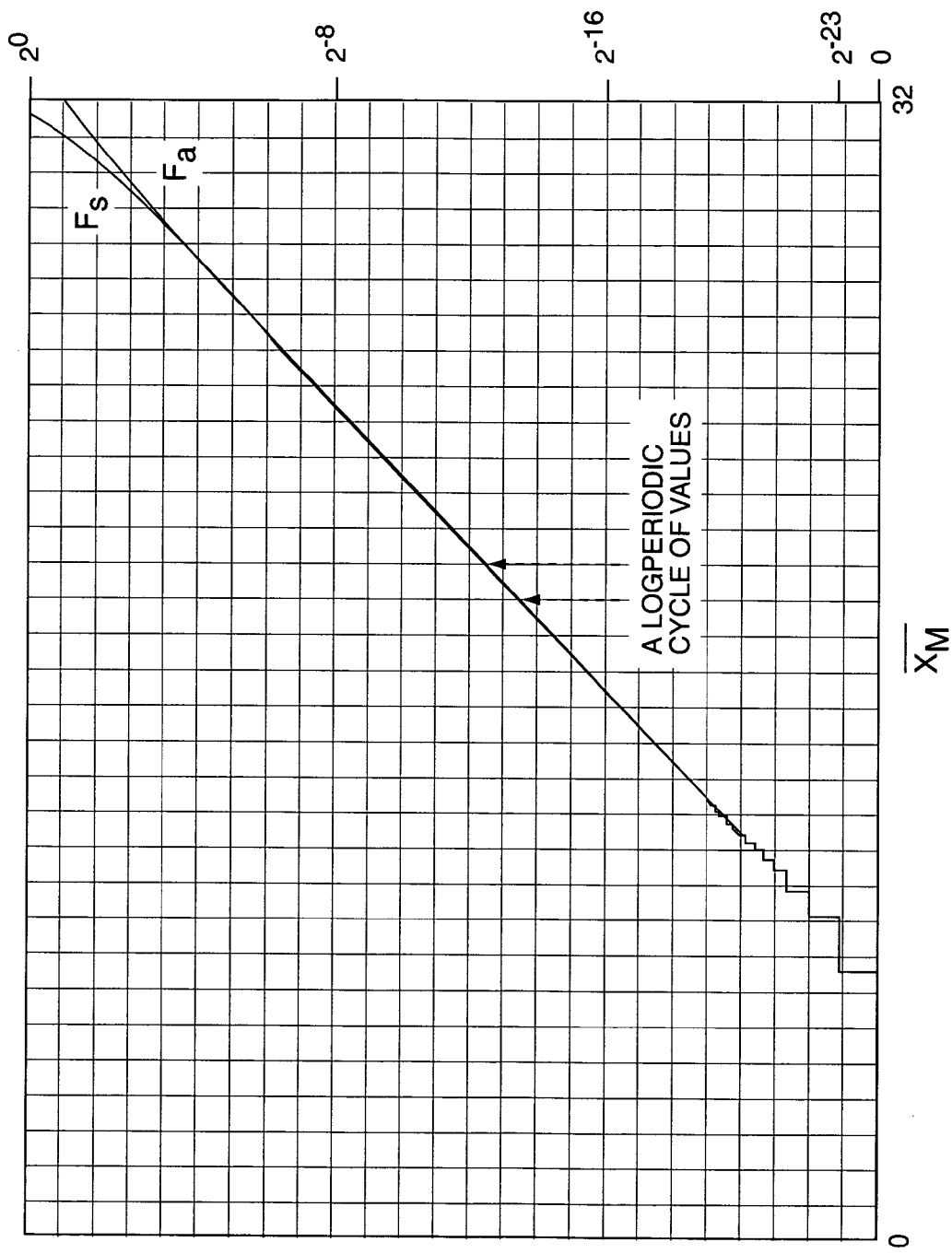
FIG. 2 illustrates a plot of one exemplary regular function.

A plot of this function for base-2 is shown in FIG. 2, for values of x between 0 and 16383 divided by 512, i.e., values of x with nine bits to the right of the binary point and 5 bits to the left of the point. The function is plotted versus the complement of 512x, denoted by $\overline{X}_M$, divided by 512, which ranges from 0 to 32 and gives a monotonically increasing function value as the argument $\overline{X}_M$ is increased. The desire is to provide fast access to the function value with an accuracy of 23 binary places, for any of given x value from the 16384 possible discrete tabular points. Alternatively base-e may be used, in which case similar accuracy is achieved with 24 binary places.

The uncompressed look-up table for the latter would comprise 16384, 24-bit words, a total of 393216 bits. The values of the words should be rounded to the nearest LSB, a fact which will have a significance described later. However, whatever those values are, any compression and decompression algorithms applied to these look-up table values are required to reproduce the desired rounded values in a bit-exact manner.

For values of x greater than 17.32, the function is zero to 24-bit accuracy in the base-e case, and is zero in the base-2 case when x>24. This may be taken as $F(x)=0$, for x>24, i.e., x>11xxx.xxxxxxxxx or $\overline{X}_M$<00xxxxxxxxxxxxx; therefore values are only needed for $\overline{X}_M$>00111111111=4095. This is particular to the exemplary function however, so will not be dwelt on here; rather, the provision of all 16384 values will be considered.

The difference between successive values for only 1 least significant bit difference in the argument $\overline{X}_M$ is obviously much smaller than the function itself, and so can be represented by fewer bits. This observation is true for any smooth function. Therefore, a first order compression algorithm comprises storing 24-bit values only for even address values of $\overline{X}_M$, and in an odd address, storing the delta-value from the previous even value.

Direct computation for the exemplary function shows that the highest delta encountered is 16376 (times $2^{-24}$), which can be accommodated within a 14-bit word. Therefore, the ROM can be reconfigured as 8192 words of 24 bits and 8192 words of 14 bits. Only the 24-bit value is required for an even address $\overline{X}_M$, and both the 24-bit and the 14-bit value are required to be read and added for an odd address $\overline{X}_M$. The ROM has thus been compressed from 16384×24=393216 bits to 8192×(24+14)=311296 bits, a saving of 21%, or a compression to 79% of the original size.

A second order algorithm can be derived by applying the process of replacing pairs of adjacent values by a value and a delta-value to the first array of 8192 24-bit values and separately to the second array of 8192 14-bit delta-values. The first application yields delta-values two apart in the original function, which are roughly double the single-spaced deltas, so requiring 15-bits of storage; the second application of the algorithm to the array of 14-bit first-order deltas yields second-order deltas, which theoretically should be in the range 0 to 31, requiring 5 bits. Due to the above mentioned rounding of the function to the nearest 24-bit word however, the range of the second-order deltas increases to −1 minimum to 33 maximum, requiring 6 bits of storage. This arises because one value may be rounded down while the adjacent word is rounded up, so increasing (or decreasing) the delta by 1 or 2.

The ROM size has now been reduced to 4096 each of 24, 15, 14 and 6-bit values, a total of 4096×59=241664 bits, a saving of 39%, or a compression to 61% of the original size. Reconstruction of a desired value comprises addressing the 4096×59-bit ROM with the most significant 12 bits of $\overline{X}_M$ to obtain the four sub-words of length 24, 15, 14, and 6-bits respectively; then the least significant 2 bits of $\overline{X}_M$ are used to control reconstruction of the desired value from the four sub-words as follows:

Denoting the 24, 15, 14, and 6-bit values by F, D2, D1, and DD respectively, for $\overline{X}_M$ LSBs=00, the desired value is F

| | |
|---|---|
| 01 | F + D1 |
| 10 | F + D2 |
| 11 | F + D1 + D2 + DD |

Forming F+D1 requires a 14-bit adder; forming F+D2 requires a 15-bit adder, and forming D2+DD requires a 6-bit adder. Therefore, 35 bits of full adder cells are needed to reconstruct the desired value. In the case of the exemplary function, the DD range of −1 to +33 can be shifted to 0 to 34 by reducing the stored 15-bit D2 value by 1, and using the rule:

for $\overline{X}_M$ LSBs=00, the desired value is F

| | |
|---|---|
| 01 | F + D1 |
| 10 | F + D2 + 1 |
| 11 | F + D1 + D2 + DD |

Thus, the 6-bit adder adds either 1 or DD to D2 according to the LSB of $\overline{X}_M$, and in general could add a value DD0 or DD1, to allow any range of DD from negative to positive to be accommodated.

Figure 3:
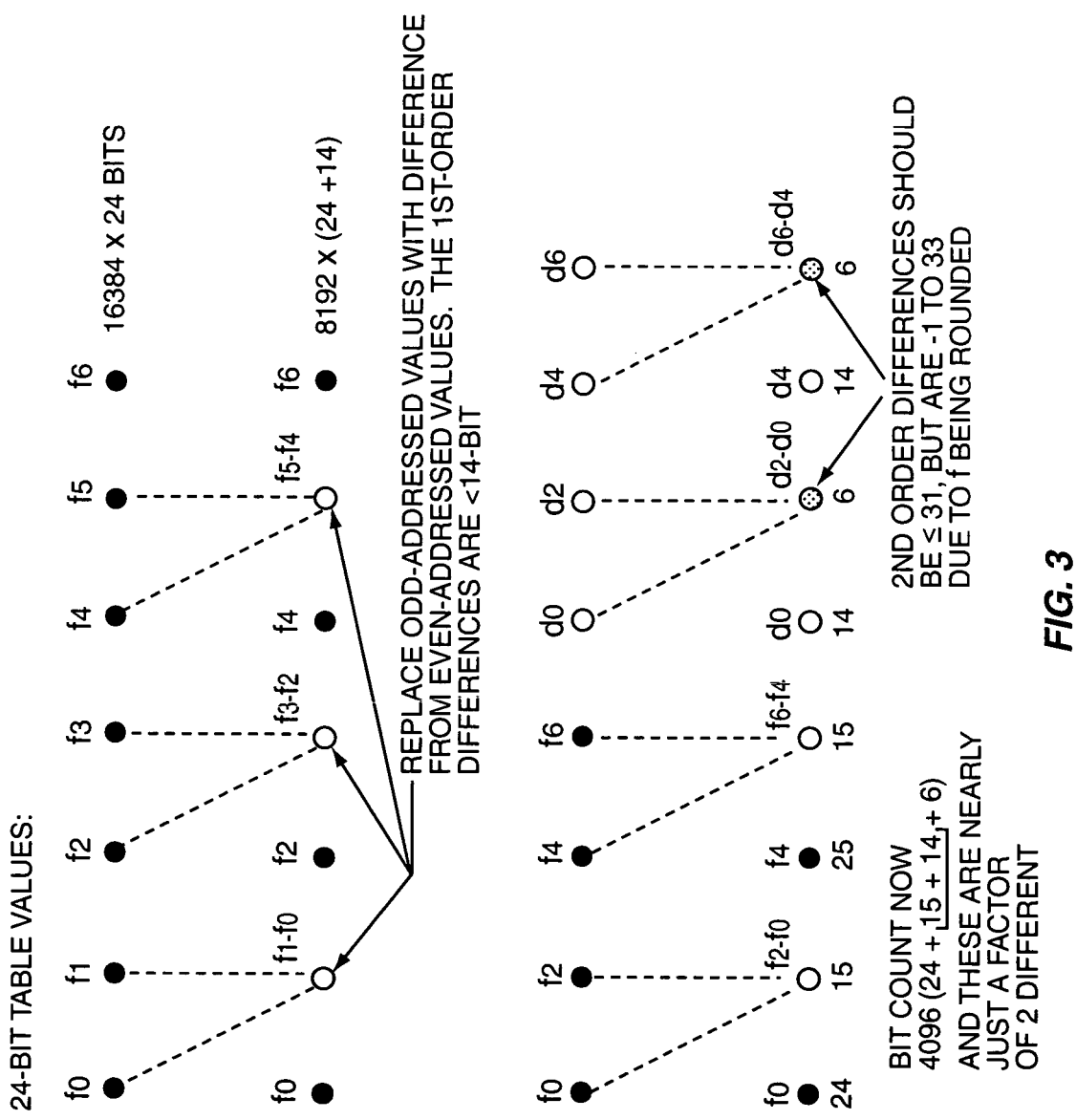
FIG. 3 illustrates one exemplary compression algorithm.

FIG. 3 depicts this algorithm for compression by iterating the process of taking differences between adjacent values. The desired values to be stored are initially the 16384 24-bit values denoted by f0, f1, f2 . . . , f6 . . . and so on to f(16384). A first application of the process of taking differences leaves the even values unchanged but each odd value is replaced with the difference from the preceding even value. For example, f5 is replaced by d4=f5−f4. For the exemplary smooth function, the differences are computed to be at maximum 14-bit long values, which is 1024 times smaller than the original 24-bit values. With even smoother functions that are almost a straight line, one might expect the difference between two values separated by only 1/16384th of the range to be 1/16384 times smaller than the maximum original value and thus 14 bits shorted. In general, this shortening of the word length is bound to occur for any smooth function. Thus, in the second row the function values are represented by 8192 pairs of values, one being of 24-bits length and the other being of 14 bits length.

In the third row of FIG. 3, the even values denoted by f0, f2, f4 . . . and the difference values denoted by d0, d2, d4 . . . are shown separated to illustrate applying the difference algorithm to the remaining f-values and separately to the d-values. The result shown in the $4^{th}$ row is that every $2^{nd}$ even value, i.e., every $4^{th}$ one of the original values, now remains unchanged as a 24-bit value, but the even values in between such as f2−f0 have become 15-bit differences. Every alternate d-value likewise remains an unchanged 14-bit value while those in between such as d6-d4 have been reduced to 6-bit second-order differences. Now the original 16384 24-bit values have been compressed to 4096 sets of values comprising a 24-bit, a 15-bit, a 14-bit and a 6-bit value.

The process may be iterated until the majority of the values are high order differences of only 2 or so bits length. These ultimate high order differences form a rather random pattern, due to the original 24-bit values having been rounded either up or down to the nearest 24 binary places. The total size of the memory reduces according to how many times the difference algorithm is iteratively applied.

Figure 4:
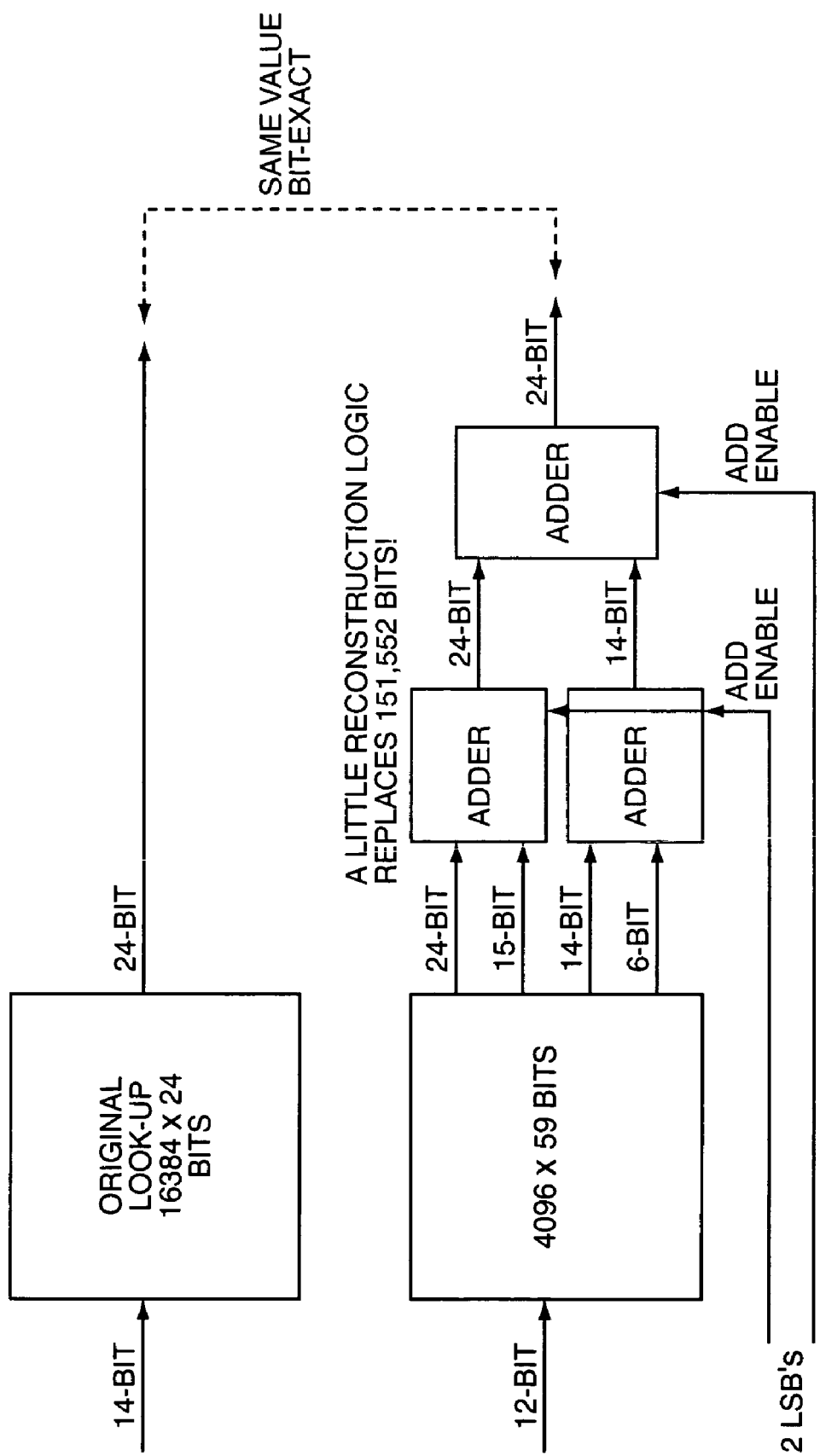
FIG. 4 illustrates exemplary reconstruction logic.

FIG. 4 shows the reconstruction logic for a second-order difference compression algorithm. The original method of storing 16384, 24-bit words shown in the upper picture comprises a look up table to which a 14-bit address is applied. The lower picture depicts the second-order difference compression technique in which the look-up table has been reduced to 4096, 59-bit values. These are addressed using only the most significant 12 bits of the original 14-bit address, which effectively define a group of four values within which the target value lies. The 59 bits comprising a 24-bit absolute value, a 15-bit double-spaced difference, a 14-bit single-spaced difference and a 6-bit 2$^{nd}$ order difference are applied to respective adders as shown. The first column of adders is enabled by the bit of second least significance to add the 15-bit difference to the 24-bit value and to add the 6-bit second order difference to the 14-bit difference if the bit is a '1', else, if the enabling bit is a '0', the 24 bit value is passed without adding the 15-bit value and the 14-bit value is passed without adding the 6-bit value. The adder of the second column adds the output of the first two adders if the least significant bit of the original 14-bit address is '1', else it passes the 24-bit value unchanged. In this way, the two least significant bits of the original 14-bit address control which of the group of 4 values is generated.

Further savings may be made by noting that D2 is almost twice D1, therefore only the 15-bit D2 need be stored plus a correction to be applied to the 14-bit value INT(D2/2)=RightShift(D2) in order to obtain the bit exact value of D1. The correction is a second order difference represented by D1−(D2/2), which, by direct calculation is found to occupy the range −1 to 8, requiring 4 bits of storage. Then it may be further realized that this 2nd order difference is nearly equal to ¼ of the value DD. Therefore it may be replaced by the difference from DD/4, which by direct calculation has the range −1 to +1, requiring 2 bits of storage, and is effectively a 3$^{rd}$-order difference, which may be denoted DDD.

Thus to reproduce each of the 16384 24-bit function values bit-exact, the stored values comprise 4096 sets of four values as follows:

A 24-bit value: F(4i)
A 15-bit value: D2(4i)=F(4i+2)−F(4i)
A 6-bit value: DD(4i)=(F(4i+3)−F(4i+2))−(F(4i+1)−F(4i))
A 2-bit value: DDD(4i)=(INT(D2(4i)/2))−(F(4i+1)−F(4i))−INT(DD(4i)/4)

The four function values F(4i), F(4i+1), F(4i+2), F(4i+3) are then reconstructable bit-exactly from:

F(4i+1)=F(4i)+INT(D2(4i)/2)+INT(DD(4i)/4)−DDD(4i)
F(4i+2)=F(4i)+D2(4i)
F(4i+3)=F(4i)+INT(D2(4i)/2)+DD(4i)+INT(DD(4i)/4)−DDD(4i)

Groups of 4 originally 24-bit values have been replaced by a total of 47 bits instead of 96, a compression factor of slightly better than 2:1.

Vice versa alternatively, the 14-bit D1 only may be stored plus a correction to be applied to 2D1 to obtain D2. Thus, other arrangements are possible, such as storing the 24-bit value F(4i)
the 14-bit value D1=F(4i+1)−F(4i)
the 6-bit value DD=(F(4i+3)−F(4i+2))−D1
the 3-bit value DDD=(F(4i+2)−F(4i))−(2D1+INT(DD/4))

which may lead to slightly simpler reconstruction. It will be appreciated that operations such as INT(DD/4) represent the trivial logical function of omitting to use two LSBs of DD.

Before computing a table showing compression achieved using algorithms of different order, a more systematic version of higher order compression will be developed based on a modified Walsh Transform. The Walsh Transform approach forms the sum and difference of pairs of adjacent values and replaces the original values with the sums and differences. For example, in a first iteration to compress data comprising f0, f1, f2, and f3, f0 is replaced with s0=f0+f1, f1 is replaced with f1−f0, f2 is replaced with s2=f2+f3, and f3 is replaced with d2=f3−f2. A circuit that computes the sum and difference of a pair of values is called a butterfly circuit.

All of the sums are arranged adjacently followed by all the differences. The differences as already seen will be shorter words than the sums. The process is then repeated on the block of sum values, and then separately on the block of difference values, each half the length of the original, to obtain a second order algorithm and so on for higher order algorithms. The highest order algorithm for 16384 values is 14. At that point the blocks have only one value each and thus cannot be compressed further. The 14th order algorithm is in fact a 16384-point Walsh Transform, and lower order algorithms stop at the intermediate stages of the full Walsh Transform. The sum and difference values associated with the final iteration are concatenated to form the final compressed values stored in memory. It will be appreciated that the final iteration may be any selected iteration, and therefore, is not required to be the 14$^{th}$ iteration.

When forming the sum of two 24-bit values, the word length can increase by one bit. However, the sum and the difference always have the same least significant bit, which can therefore be discarded on one of them without losing information. By discarding it from the sum and using $$INT\left(\frac{f0+f1}{2}\right) = RightShift(f0+f1) \qquad (2)$$

instead, the sum is prevented from growing in length. Upon reconstruction, the difference is added to or subtracted from the sum and its LSB is used twice by feeding it into the carry/borrow input of the first adder/subtractor stage to replace the missing sum LSB. Mathematically, the modified transform butterfly can be written:

SUM(*i*)=INT ((F(2*i*+1)+F(2*i*))/2)

DIFF(*i*)=F(2*i*+1)−F(2*i*)

and reconstruction can be written as:

F(2*i*+1)=SUM(*i*)+INT (DIFF(*i*)/2)+AND(1,DIFF(*i*))

F(2*i*)=SUM(*i*)−INT (DIFF(*i*)/2)−AND(1,DIFF(*i*))

The above is a modified version of the well-known "Butterfly" operations used in Walsh-Fourier transforms:

SUM(*i*)=F(2*i*+1)+F(2*i*)

DIFF(*i*)=F(2*i*+1)−F(2*i*)

and its inverse:

F(2*i*+1)=(SUM(*i*)+DIFF(*i*))/2

F(2*i*)=(SUM(*i*)−DIFF(*i*))/2

A Fast, base-2, Pseudo-Walsh Transform (pseudo-FWT) may be constructed using the modified Butterfly described above to transform groups of two adjacent values to a value and a delta-value, or groups of 4 adjacent values to a value, two delta-values a 2nd-order delta-value, and so forth. This makes it a systematic process to explore the characteristics of and implement higher order algorithms. The FORTRAN code for an in-place Pseudo-Walsh transform is given below:

```
C F IS THE GROUP OF M VALUES TO BE PSEUDO-
    WALSH TRANSFORMED
C AND N=LOG2(M) IS THE ORDER OF THE ALGO-
    RITHM
    SUBROUTINE PSWLSH(F,M,N)
    INTEGER*4 F(*),SUM,DIFF
    N1=M/2
    N2=1
    DO 1 I=1,N
    L0=1
    DO 2 J=1,N1
    L=L0
```

```
DO 3 K=1,N2
SUM=(F(L+N2)+F(L))/2
DIFF=F(L+N2)−F(L)
F(L+N2)=DIFF
F(L)=SUM
L=L+1
3 CONTINUE
L0=L+N2
2 CONTINUE
N1=N1/2
N2=2*N2
1 CONTINUE
RETURN
END
```

The following table shows the amount of data compression of the exemplary function achieved using different order pseudo-Walsh algorithms:

| Order of Algorithm | Number of Words | Total Wordlength | Total Number of Bits Base-e | Total Number of Bits Base-2 |
|---|---|---|---|---|
| 0 | 16384 | 24 | 393216 | 376832 |
| 1 | 8192 | 38 | 311296 (319488) | 294912 |
| 2 | 4096 | 59 | 241664 (258048) | 221184 |
| 3 | 2048 | 93 | 190464 (215040) | 169984 |
| 4 | 1024 | 147 | 150528 (182272) | 135168 |
| 5 | 512 | 238 | 121856 (161792) | 106496 |
| 6 | 256 | 381 | 97536 (142848) | 89088 |
| 7 | 128 | 624 | 79072 (135424) | 71680 |
| 8 | 64 | 1084 | 69376 | 59968 |
| 9 | 32 | 1947 | 62304 | 51136 |
| 10 | 16 | 3507 | 56112 | 45072 |
| 11 | 8 | 5738 | 45904 | 37096 |
| 12 | 4 | 10020 | 40080 | 30492 |
| 13 | 2 | 17782 | 35564 | 26296 |
| 14 | 1 | 32085 | 32085 | 23188 |

The bit count in parentheses is that obtained when a Walsh Transform using the standard Butterfly operation is used. The inferior compression of the standard Walsh Transform is partly due to growth of the word lengths of sum terms, and partly due to an amplification of the rounding errors in the original table values when higher-order differences are formed, which is less noticeable when the modified Butterfly is used and the LSBs of the sum terms are discarded. In both cases, bit-exact reconstruction of the original values is achieved when the appropriate inverse algorithm is applied. In the base-2 case, the function $F_a(x)=Log_2(1+2^{-x})$ is computed to 23 binary places, and 24 places in the base-e case, which represent similar accuracies.

Thus, with the ultimate transform order of 14 operating on the whole array, the look-up table reduces to a single word 32085 (23188) bits wide, which is less than 2 bits per table value on average; yet each value can be reconstructed to 24-bit (23-bit) accuracy. A single word is no longer a table, and needs no address, since it will always be "read", the values can just be hard-wired into the inputs of the reconstruction adders. However, 14 levels of reconstruction adders are required and the number of single-bit adder cells required is around 65000. Because an adder cell is larger than a memory bit, this does not represent the minimum silicon area. The minimum area is achieved at some compromise between the number of bits stored and the number of adder cells required for value reconstruction. Nevertheless it appears that a silicon area reduction factor of around 4 or 5 is entirely feasible.

It may also be concluded that there is shown above a method to build a machine that will compute any discrete value of a smooth function. The memory table has disappeared in the limit, being replaced with hard-wired inputs to the adder tree. This can lead to a further stage of simplification in which adder stages that add zero may be simplified to handle only carry propagation from the preceding stage, and likewise adders that always have a "1" on one of their inputs can be similarly simplified.

The pseudo-FWT table compression algorithm may also be applied to the 512-word table needed to store the value $2^{-0.X_2} \log_e(2)$ when base-2 logs are used, and $X_2$ is 9 bits long. This function is an approximation to the above exemplary function which can suffice over a portion of the argument range. It is useful to use this approximation over the whole range and to store only corrections needed, which have a shorter word length.

Using base-2; the bit patterns for this base-2 exponential function repeat with a shift when the argument changes from $0.X_2$ to $1.X_2$, $2.X_2$, etc., so only the bit patterns for the principal range denoted by $0.X_2$, where $X_2$ is a 9-bit value, need be synthesized. The following table gives the total number of bits required to be stored to synthesize the function, rounded to the nearest 23 bits after the binary point, for values of the argument $X_2$ from 0 to 511.

| Order of Algorithm | Number of Words | Total Wordlength | Total No. of Bits |
|---|---|---|---|
| 0 | 512 | 23 | 11776 |
| 1 | 256 | 37 | 9472 |
| 2 | 128 | 57 | 7296 |
| 3 | 64 | 89 | 5696 |
| 4 | 32 | 139 | 4448 |
| 5 | 16 | 219 | 3504 |
| 6 | 8 | 358 | 2864 |
| 7 | 4 | 585 | 2340 |
| 8 | 2 | 974 | 1948 |
| 9 | 1 | 1608 | 1608 |

The final row constitutes a machine for computing the function without a memory, using only controlled adders with fixed, hardwired inputs.

In addition to the above bits, corrections to this exponential function are needed to obtain the values of $F_a(x)=Log_2(1+2^{-x})$ or $F_s(x)=-Log_2(1-2^{-x})$, which are used in logarithmic arithmetic for addition and subtraction in the log-domain.

Figure 5:
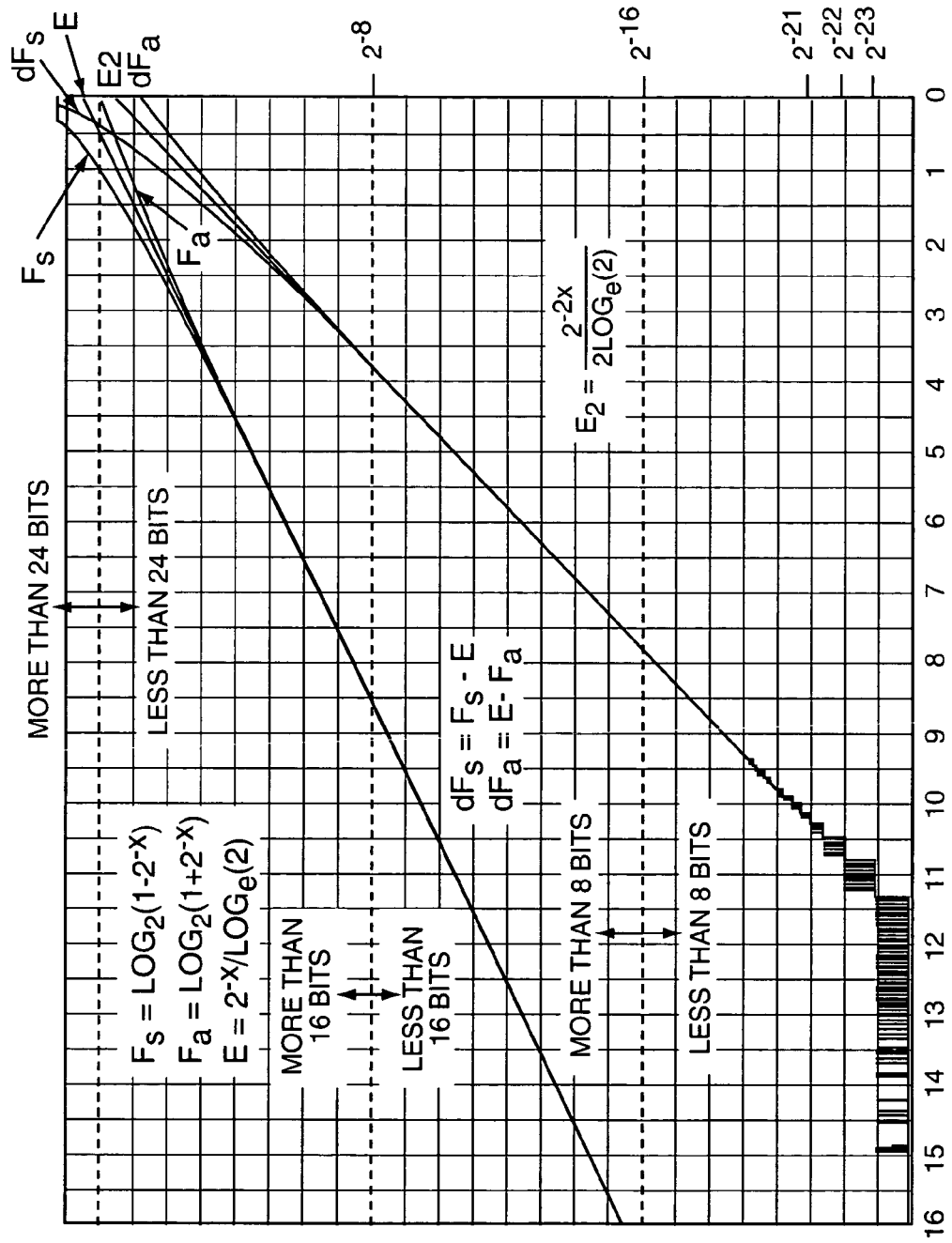
FIG. 5 illustrates a plot comparison between a true monotonic function and an exponential approximation.

The differences between the desired values of $F_a$ and $F_s$ and the exponential function are plotted for the base-2 case in FIG. 5. These differences can be stored in a look-up table that occupies less space than the original functions, the chip area being indicated approximately by the triangular area under the curve to the bottom right. Furthermore, since the corrections also form a regular function, that table also can be compressed by the techniques described herein.

In a variation of the compression algorithm, the reconstruction adders may be largely eliminated. This is based on the realization that the sum of a given 24-bit value and a given 14-bit delta value always leads to the same 14 LSBs as a result. Therefore it is just as efficient to store the 14 LSBs of the pre-computed sum of the 24-bit and the 14-bit value, i.e., c0=f0+d0, in place of the 14-bit delta, i.e., d0. It is also necessary however to store an extra bit indicating whether the sum of the 14-bit delta to the 24-bit value caused a carry from the 14th bit to the $15^{th}$ bit. Thus by storing 15 bits instead of 14, the first 14 bits of the reconstruction adder can be eliminated. The $15^{th}$ bit is applied to a carry propagation circuit for the most significant 10 bits. A carry propagation circuit is simpler than full adder, and may be eliminated if there is a later stage of addition in the application into which the 15th bit could be inserted. This is explained with the aid of FIG. 6. In effect, the least significant bits of a pair of original adjacent values are retained, but associated to a common most significant part. In addition, an extra bit indicates whether the most significant part has to be incremented when reconstructing the second value of the pair.

FIG. 6A shows a conventional butterfly circuit for adding or subtracting the same 14-bit value to/from the 24-bit value to produce one of two alternative values according to the SELECT control line. FIG. 6B shows that the butterfly circuit can be simplified into a 14-bit adder for adding or subtracting the 14-bit value to/from the 14 LSBs of the 24-bit value to produce one of two alternative 14 LSBs of the result, plus a carry or borrow bit from the add or subtract operation which is combined with the 10 MSBs of the 24 bit value to produce one of two alternative 10-bit MSB patterns. The MSB patterns may be the same if no borrow or carry is generated by the 14-bit add/subtractor. In FIG. 6C, the two alternative 14-bit results are simply pre-stored, that corresponding to the difference (subtract) operation is stored along with the 10 MSBs in place of the 24-bit value, while that corresponding to the sum result is stored in place of the 14-bit value. However, a 15$^{th}$ bit is needed to indicate whether the 10 MSBs are the same or incremented by 1 for the sum case. The 15$^{th}$ bit is always a zero in the difference case and is shown as an input to the selector alongside the 14 LSBs from the 24-bit word. If zeros are implemented in memory as the absence of a transistor, the column of zeros takes up no silicon area. The carry propagator is still needed in FIG. 6C to increment the 10 MSBs if necessary.

The selector in FIG. 6C does not need to be explicitly provided. It is inherent in memories that the address bits select one or other of a number of stored values. Therefore the two alternative 14 (or 15) bit patterns are simply selected by the select line, which is the least significant bit of the 14-bit address. The 10 MSBs are addressed by the 13 MSBs of the address. Thus, the memory comprises 8192 10-bit words and 16384 14/15-bit words, a total of 319488 bits, which is 8192 bits more for the benefit of eliminating a 14-bit adder. Finally, FIG. 6D shows the omission of the carry propagator by delaying incrementing the 10 MSBs with the carry bit and simply feeding forward the carry bit to be used at a convenient opportunity in a subsequent adder.

The division of the 24-bit word into a 10-bit part and a 14-bit part in FIG. 6 arises from the exemplary function exhibiting a delta between even and odd addressed values that is never more than a 14-bit value. The 10 MSBs are always the same or differing only by 1 between an even and adjacent odd-addressed value. Similarly, the difference between values 2 apart is never more than a 15-bit value, and the difference between values 4 apart is never more than a 16-bit value. Therefore, a group of 4 (or even 5) adjacent values have the same most significant 8 bits except for a possible increment of 1, while having different least significant 16-bit parts. Therefore, an alternative realization is to arrange the memory as 4096 8-bit values and 16384 17-bit values, the 17th bit indicating whether the 8 MSBs have to be incremented by 1 or not. This reduces the number of bits to 311296. A table showing the number of bits of memory for different splits is shown below.

| Group Size | No. of MSBs | No. of LSBs (+1) | Memory Bits |
|---|---|---|---|
| 2 | 10 | 15 | 319488 |
| 4 | 8 | 17 | 311296 |

-continued

| Group Size | No. of MSBs | No. of LSBs (+1) | Memory Bits |
|---|---|---|---|
| 8 | 7 | 18 | 309248 |
| 16 | 6 | 19 | 317440 |
| 32 | 5 | 20 | 330240 |
| 64 | 4 | 21 | 345088 |

The table indicates there is an optimum split which minimizes the number of bits.

This process can now be iterated by recognizing that the LSB patterns within each group are monotonically increasing values. For example, in each group of 64 values in the last case, no two adjacent values can differ by more than a 14-bit value. Therefore these values can be divided into 32 groups of 2, storing for each pair 7 MSBs (which may have to be incremented by 1) and two alternative 14 or bit LSB patterns, the 15th bit indicating if the 7 MSBs should be incremented by 1.

The different ways to represent groups of 64 21-bit values is shown below, with the overall number of memory bits implied.

| Group Size | No. of MSBs | No. of LSBs (+1) | Bits for 64-group | Total Memory |
|---|---|---|---|---|
| 2 | 7 | 15 | 1184 | 304128 |
| 4 | 5 | 17 | 1168 | 300032 |
| 8 | 4 | 18 | 1184 | 304128 |

Repeating the procedure for the case of groups of 32 yields:

| Group Size | No. of MSBs | No. of LSBs (+1) | Bits for 32-group | Total Memory |
|---|---|---|---|---|
| 2 | 6 | 15 | 576 | 297472 |
| 4 | 4 | 17 | 576 | 297472 |
| 8 | 3 | 18 | 588 | 303616 |

For groups of 16, obtain:

| Group Size | No. of MSBs | No. of LSBs (+1) | Bits for 16-group | Total Memory |
|---|---|---|---|---|
| 2 | 5 | 15 | 280 | 292864 |
| 4 | 3 | 17 | 284 | 296960 |

For any given table of a regular function, it is possible to carry out the above trials and determine the method that will result in the minimum number of stored bits.

The above methods can be used not only for smooth functions, but also for piecewise smooth functions. For example, if groups of 32 values at a time are compressed using any of the above techniques, it is only necessary for the values within each group of 32 to represent a smooth function, i.e., a continuous function. Discontinuities between different groups are then of no significance.

Figure 7:
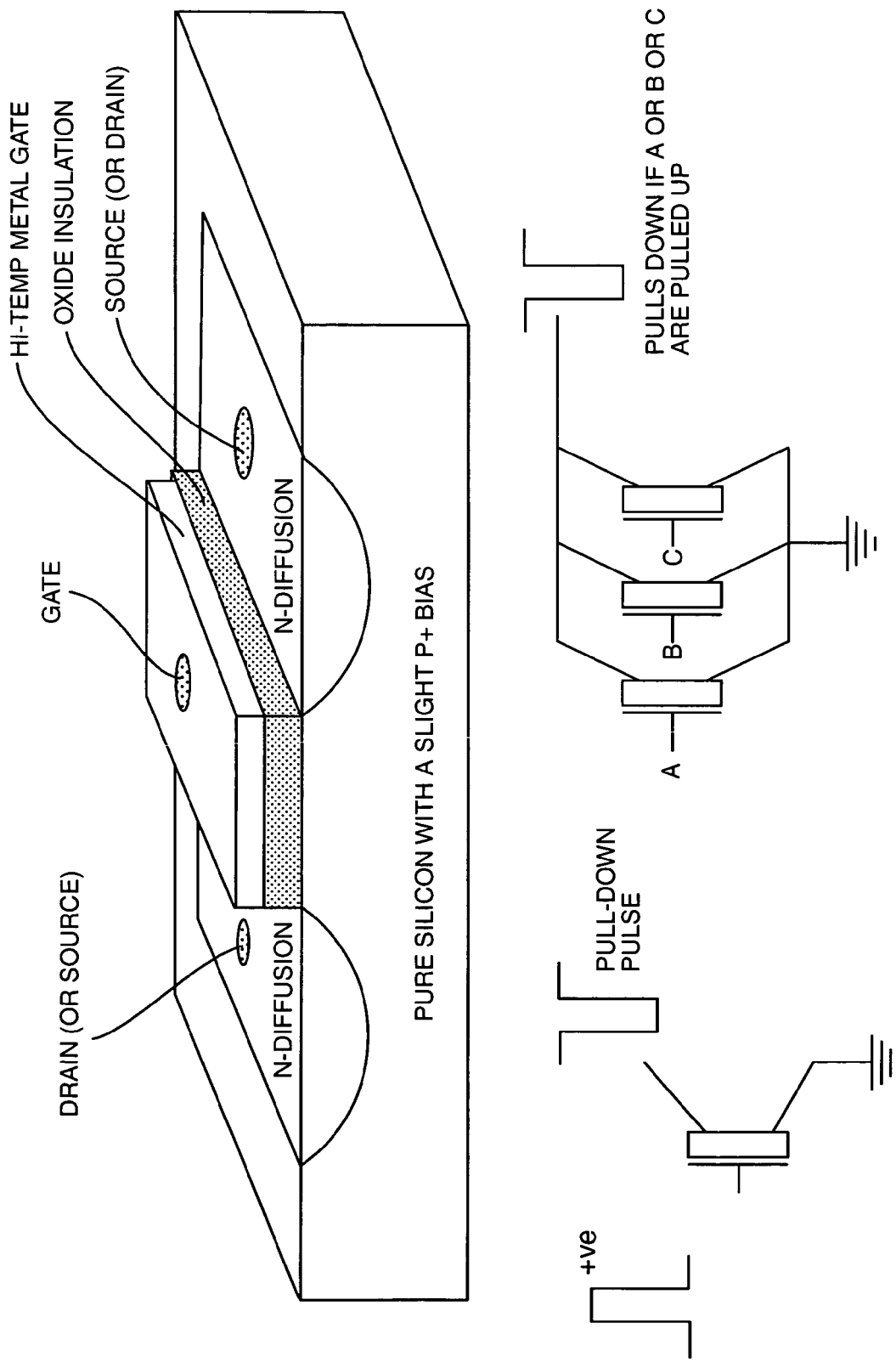
FIG. 7 illustrates a conventional MOS transistor.

To explain how the technique can be applied to more random data, the construction of a typical MOS ROM is first described. FIG. 7 shows the construction of a MOS transistor. A conducting gate electrode is made of a conducting material with a high melting point so as to withstand processing temperatures, and is separated from the silicon substrate by a thin insulating layer, generally of silicon dioxide. The gate and its underlying oxide insulation are generally produced by covering the whole substrate with gate structure first and then etching away except where gates are desired. Then drain and source electrodes are formed by implanting impurities on either side of the gate, the gate acting as its own mask to ensure that drain and source adjoin the gate exactly. The implanted impurities have to be allowed to integrate with the silicon substrate crystal structure by raising the temperature to just under the melting point of silicon. Having formed MOS transistors in this way, they may be interconnected by depositing aluminum interconnecting tracks.

Figure 8:
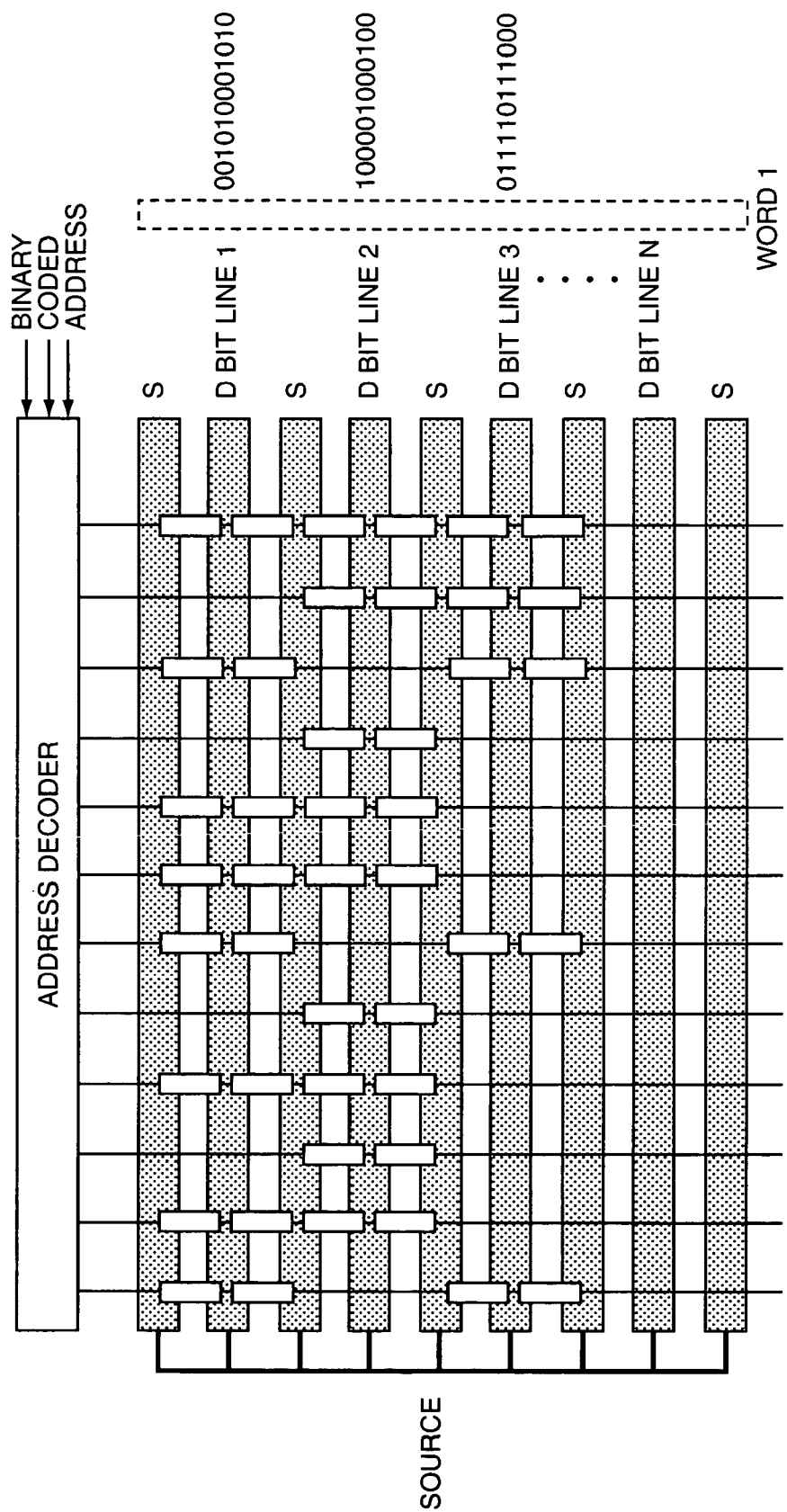
FIG. 8 illustrates the construction of one exemplary memory circuit.

FIG. 8 shows a ROM constructed in this way. Alternating stripes of source and drain diffusion form a multitude of transistors with their sources and drains paralleled. The transistors are located where the gate structures have not been etched away. A transistor is placed where a binary 1 is desired to be stored, and no transistor is placed where a binary 0 is to be stored. Actually in FIG. 8, a transistor is shown as comprising a gate from the source line above the drain line and a gate from the source line below the drain line. Both are enabled by the same gate signal and thus are in effect two transistors in parallel. The number of separate drain lines corresponds to the number of bits in a word. All of the source lines for the same word are connected at the left hand side to a word row enable signal, which is pulled to ground to read a word in that row.

Different columns of transistors correspond to different words in the row. An address decoder accepts a binary address input and puts an enable signal on all the gates in one column, thus enabling all the bits of a particular word to the drain lines. The drain line is pulled down by a turned on transistor if the word contains a zero in that position, or else is not pulled down if a transistor is absent, corresponding to a 0 in the word.

Multiple rows of words can be constructed and the address lines run top to bottom through all rows. The source enable lines for each word-row are connected to a second row-address decoder and the whole address is then a combination of the column address and the row address. A suitable row-address decoder that pulls down the source lines of the enable word-row is shown in FIGS. 9A and 9B.

As shown in FIG. 9A, a cascadable building block comprises two MOS transistors with their sources commoned to the "cascoding input" C. An address line is connected to the gate of one transistor and its drain develops a complementary address signal, which is connected to the gate of the other transistor. The result is that either one transistor or the other conducts between source and drain depending on whether the address line is high or low. A cascade of this building block is shown in FIG. 9B, in which the drain connections DR1 and DR2 of a first device controlled by address bit A1 are connected to the source connections of two identical building blocks higher in the chain which are both controlled by address bit A2. Their drain connections are in turn connected to pairs of building blocks that are all controlled by address bit A3 to present 8 drain connections, and so forth. In this way, an N-bit address bit pattern is decoded by the binary tree of building blocks to produce a conducting path from one of $2^N$ final drain connections to the first source connection annotated "Chip Enable".

Pulling down the chip enable line then pulls down one of the drain connections corresponding to the enabled conducting path, which in turn pulls down one of the word-row source lines, which in turn pulls down drain lines for that word row corresponding to which word transistors have been turned on by the column address. A sensing amplifier (not shown) detects which bit lines are being allowed to pull current from the supply and creates the output bit pattern corresponding to the addressed word. The sensing amplifier compensates for the loss through the long chain of transistors and provides a buffered logic level output to the processor external to the memory.

Figure 10:
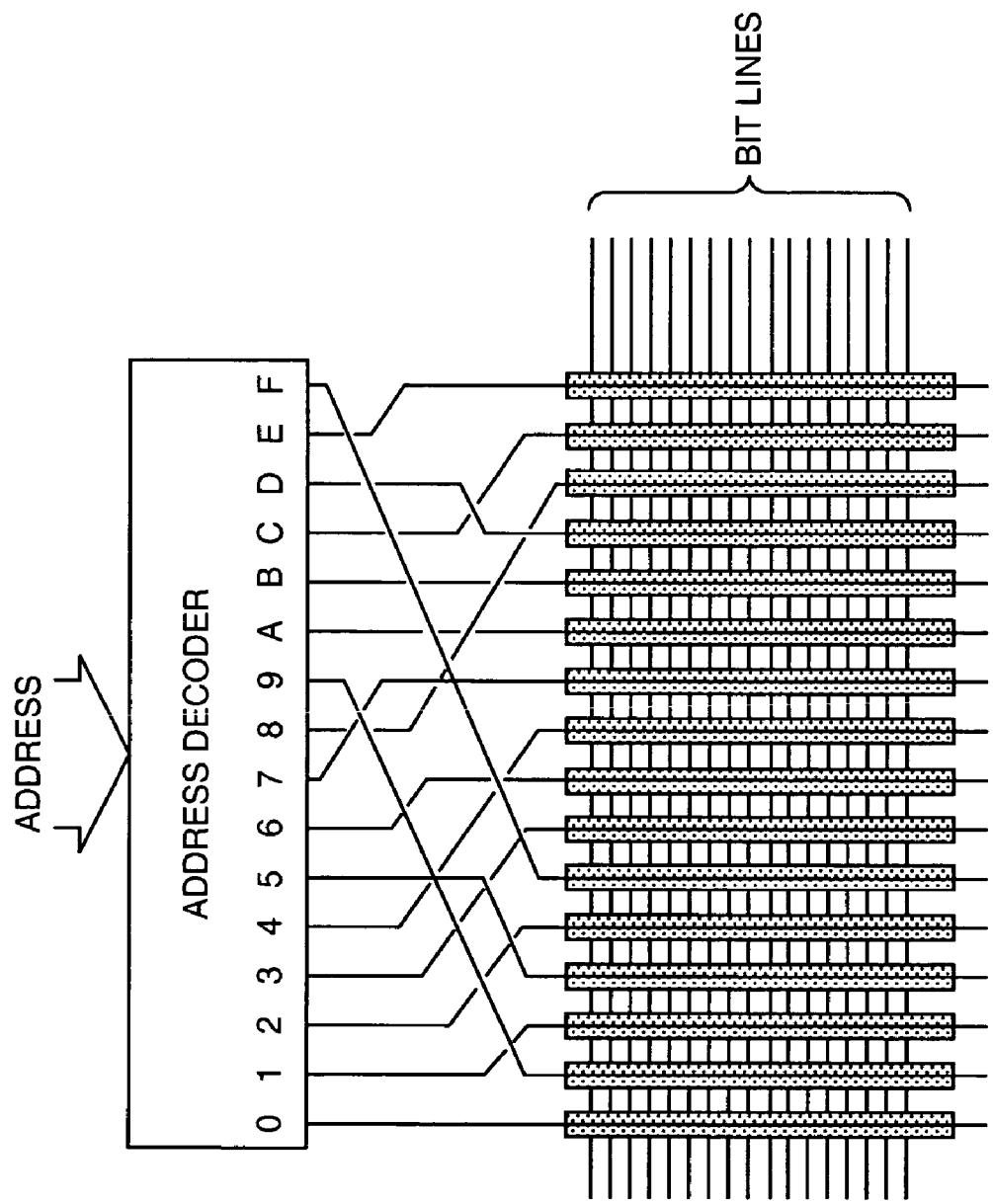
FIG. 10 illustrates one exemplary process for arranging stored data in a sorted order.

FIG. 10 shows how a memory containing random values can be arranged in order of numerical value. The words are simply sorted and arranged in numerical order, while remaining connected to the same output line of the address decoder. This requires that the decoded address lines be crisscrossed as shown, which can be accomplished with a suitable multi-layer interconnection pattern. The address lines can be re-arranged in a different crisscross pattern for connection to the next row of words, which will likely be sorted in a totally different order. This in itself does not achieve compression, but is merely illustrative of the possibility to arrange even random data on a chip in a monotonically increasing order of numerical value while still reading out the correct value associated to each address.

Figure 11:
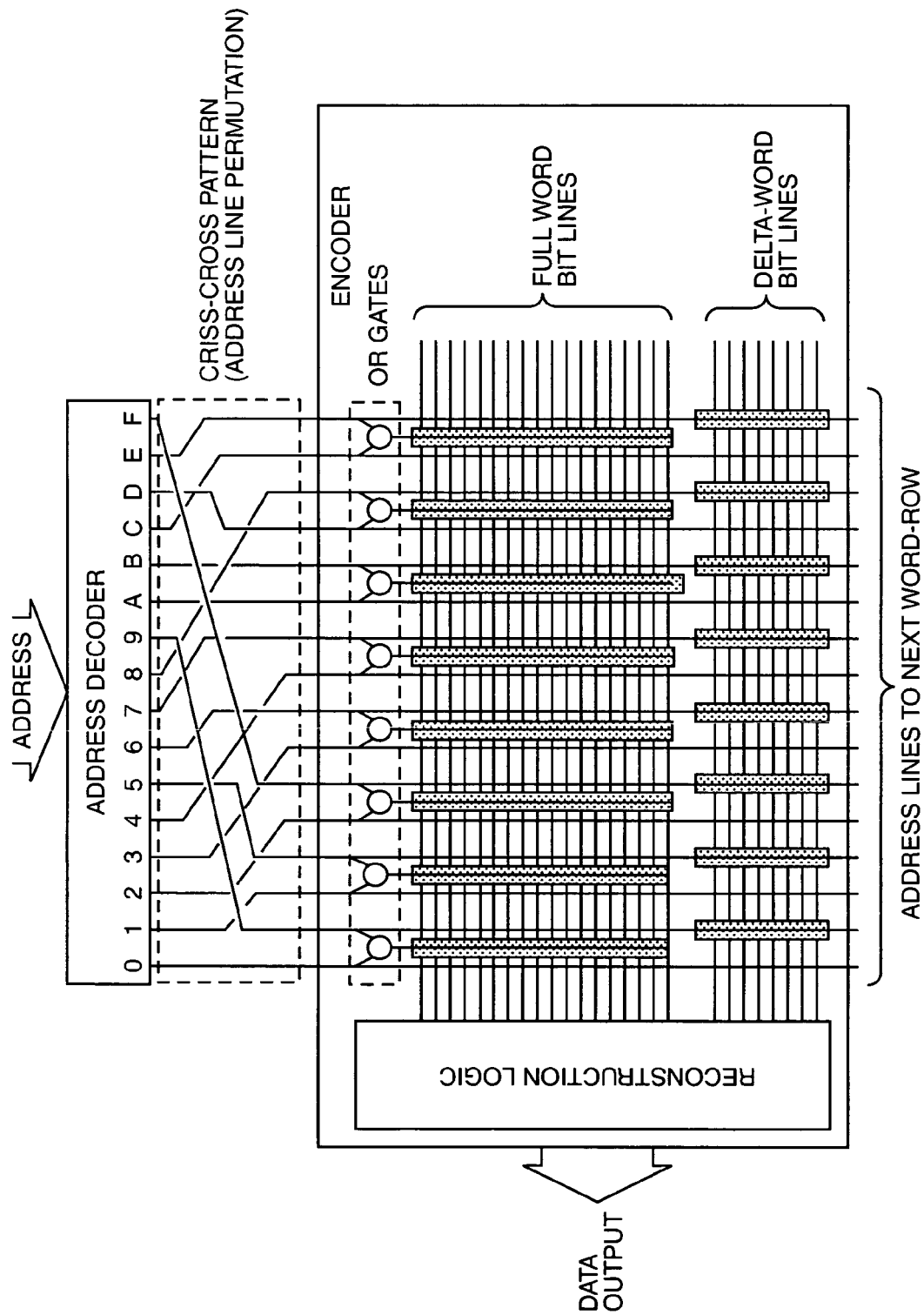
FIG. 11 illustrates one exemplary implementation for a memory using first-order compression of random data.

FIG. 11 illustrates the implementation of a memory for first-order compression of random data using a decoder, crisscross line pattern, and an encoder. Every alternate full word, in value-sorted order, has been removed compared with FIG. 10. The preceding word to the removed word is now addressed by its own address as well as the address of the omitted word that was adjacent to it by including an OR gate to OR the two addresses. The address line of the omitted word now enables a shortened delta-word, which is to be added to the preceding word by the reconstruction logic in order to recreate the omitted word. The number of bits of memory has been reduced to a full word and a delta word for every pair of original full words at the cost of a two input OR gate per pair. A two-input OR-gate is at maximum 4 transistors, which can be counted as four bits. This should be added to the delta-word length in estimating the amount of silicon area saved.

The address-line crisscross pattern also requires chip area. By relocating the OR gates below the full words, the crisscross connection pattern may run over the top of the area occupied by the full-words using a suitable number of metallization layers insulated or mutually isolated from each other. Such layers may be fabricated using photo-lithographic techniques. For the purposes of this invention it is assumed that an essentially unlimited number of metallization layers can be used, and that insulative layers isolate the crisscrossed interconnection lines and/or patterns of crisscrossed interconnection lines from unwanted contact. Indeed, using layer upon layer of interconnect patterns, in order to store more data using the same chip area, exploits the vertical dimension.

One has to be careful in extending the concept of higher order difference algorithms to random data, as differences of greater than first order may show no meaningful regularity. Instead, choosing one full word as a base value for a group of words, and replacing the other words in the group by their deltas from the base value can improve the efficiency of compression. For example, a group of four values f0, f1, f2, and f3 can be replaced by f0, d1=f1−f0, d2=f2−f0, and d3=f3−f0. The logical OR of 4 addresses must then address the value of f0. A four input gate is a maximum of 8 transistors. The silicon area occupied by this 4-input OR gate is the cost for the savings of reducing 3 full-words f1, f2, and f3 to three delta-words d1, d2, and d3. The 4-input OR gate is only twice as complex as the 2-input OR-gate but the memory reduction is now approximately 3 times greater. Therefore the overhead of the OR-gate has reduced in comparison to the savings achieved. Wherever two data values to be stored are identical and thus appear next to one another in value sorted order, they are replaced by a single value and no delta need be stored. Then the address line corresponding to the zero delta is not needed, and the OR of the two address lines to the single stored value may be absorbed into the last stage of address decoding by using an AND-OR gate as shown in FIG. 12.

Figure 12C:
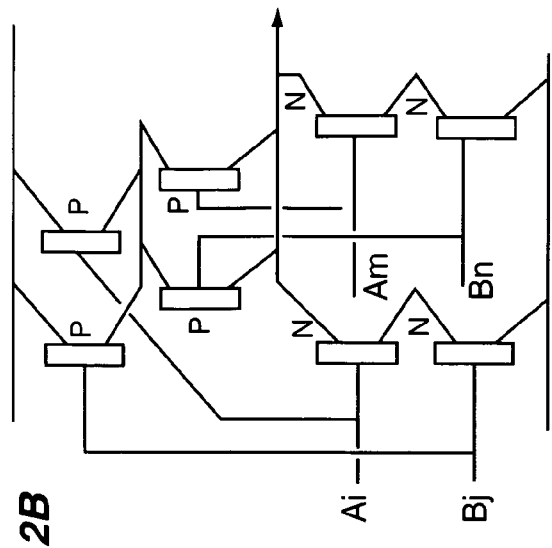
FIGS. 12a-12C illustrate one exemplary implementation for address decoding.
Figure 12B:
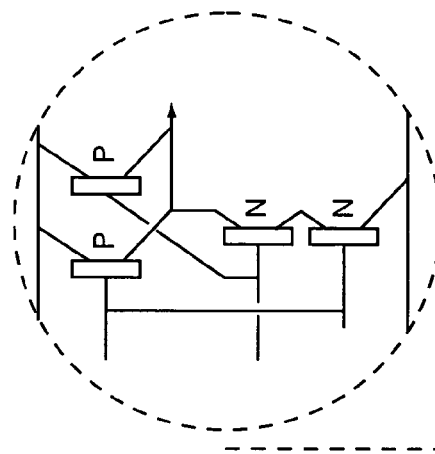
Figure 12A:
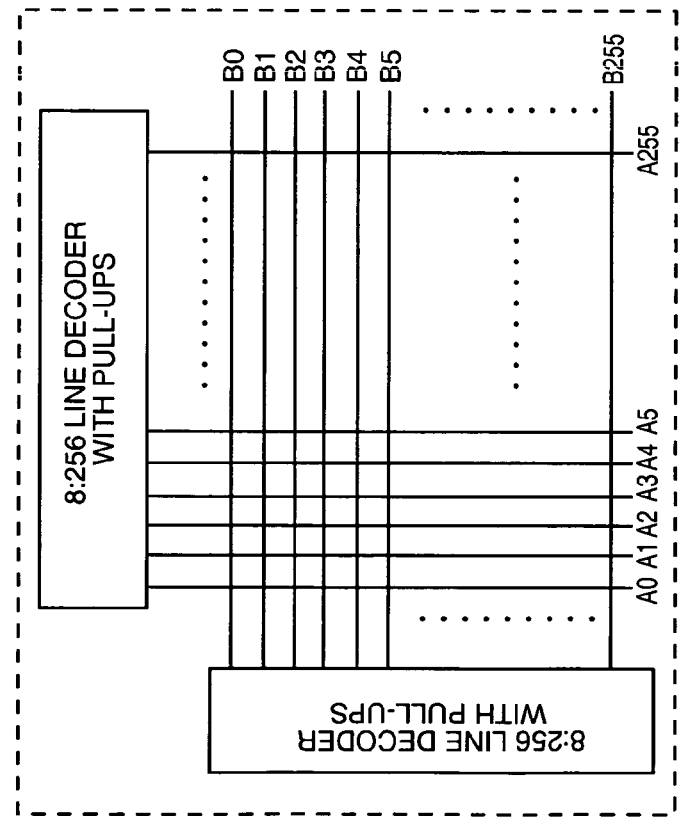

FIG. 12A shows two decoders of the FIG. 9 type for decoding, for example, 8 address bits to one 256 address lines. Because FIG. 9 has open-drain outputs, pull-up transistors (or resistors) have to be added to reset the outputs to a known state between memory reads. The 256-lines of one decoder (A0 .... A255) are then crossed over the 256 lines (B0-B255) of the other to give 65536 crossing points. When an individual one of the 65536 lines must be decoded, a 2-input AND gate is placed at that junction, as shown in FIG. 12B, giving an address decoder complexity of 4 transistors per output line, as the number of transistors in the 8*256 line decoders is negligible in comparison. When however only the OR of two addresses is needed, FIG. 12C shows how the 8 transistors of two AND gates can be reconnected to form an AND-OR using no extra transistors.

Analyzing some typical DSP programs used in mobile devices made an estimate of the savings possible using the above technique. A first program comprising 8464 16-bit instructions was determined to comprise only 911 different 16-bit values. Clearly many values are repeated multiple times and the above technique of storing these only once and using AND-OR address decoding can save a factor of 9 approximately in chip area without needing to use any delta values. A second program of 2296 words was found to comprise only 567 different 16-bit values, also allowing a significant compression factor. The combined programs compress from 10760 words to 1397 words. The 4-transistors per address used in AND-OR address decoding were required in the conventional memory's address decoder, and therefore do not add complexity. A more accurate estimate of the size reduction is to add the 4-transistors per address of the address decoder to the 16 transistors per word of the memory array to obtain 20 transistors per word total for the conventional memory, which reduces to 4+16/9 transistors, which represents approximately a factor of 3 reduction.

When the number of words to be stored exceeds the number of possible values, for example storing 1 megaword of 16-bit values, it is evident that it is never necessary to store move than 65536 values, using AND-OR address decoding to combine all addresses at which the same word is to be stored to enable that particular 16-bit word. A memory of this type benefits from the use of more overlapping interconnecting layers to handle the complex interconnection pattern of AND-OR addressing. The technique is thus a method of using the vertical dimension on chips (more interconnecting layers) to realize more efficient memories.

Figure 13:
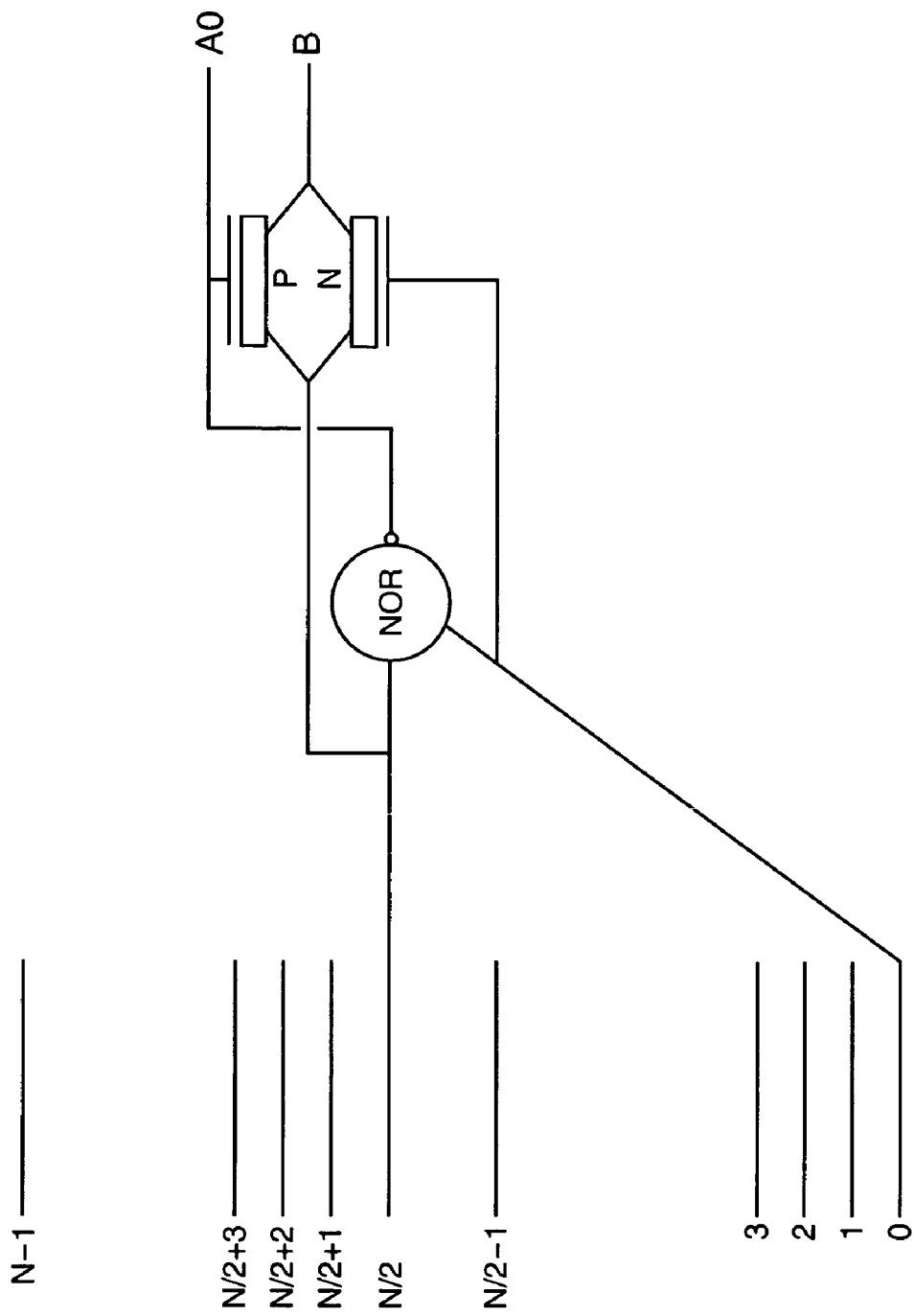
FIG. 13 illustrates one exemplary priority encoder.

In the latter case, the 65536 possible words do not even need to be stored. Having AND-ORed the appropriate address lines into one of 65336 lines that are required to cause an output of values from 0 to 65535 to be generated, a device called a priority encoder can be used as a 65536:16 line encoder, which is the inverse function of a 16:65536 line address decoder. A priority encoder can be constructed with at most 6 transistors per input, which is less than the 16-bits per word otherwise needed. A priority encoder is shown in FIG. 13.

A set of N inputs numbered 0 to N−1 is divided into a first half 0 to N/2−1 and a second half N/2 to N−1. Pairs of corresponding lines are selected from the first and second halves, for example lines 0 and N/2 as shown, to be ORed together. The NOR gate gives a logic '0' out if either of the inputs are a 1. The N-type transistor conducts if the lower input was a 1 and connects the upper input, which must be a 0, to output B. The P-type transistor conducts if either input was a 1, and connects the upper input to the output B if the upper input was a 1. Therefore, output B has the polarity of the upper input if either of the inputs was a 1, else output B is open circuit. All output B's are paralleled forming a wired OR, giving a 1 out if the active input line lay in the upper half of the inputs, else a '0' is output. This is the most significant bit of the desired encoding. The process is then repeated for the N/2 outputs A0 to A(N/2−1) to produce the second most significant output bit of the desired encoding, and so forth. The number of stages required to fully encode the input lines is thus N/2+N/4+N/8 . . . =N−1, and each stage comprises 6 transistors (the 4-Transistor NOR gate plus a P and an N type transistor).

Figure 14B:
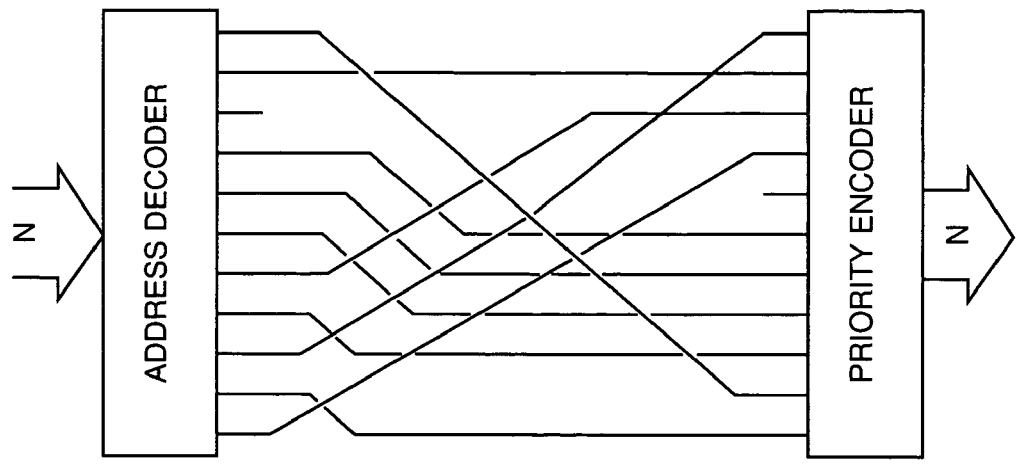
FIGS. 14A and 14B compare exemplary encoder and decoder combinations.
Figure 14A:
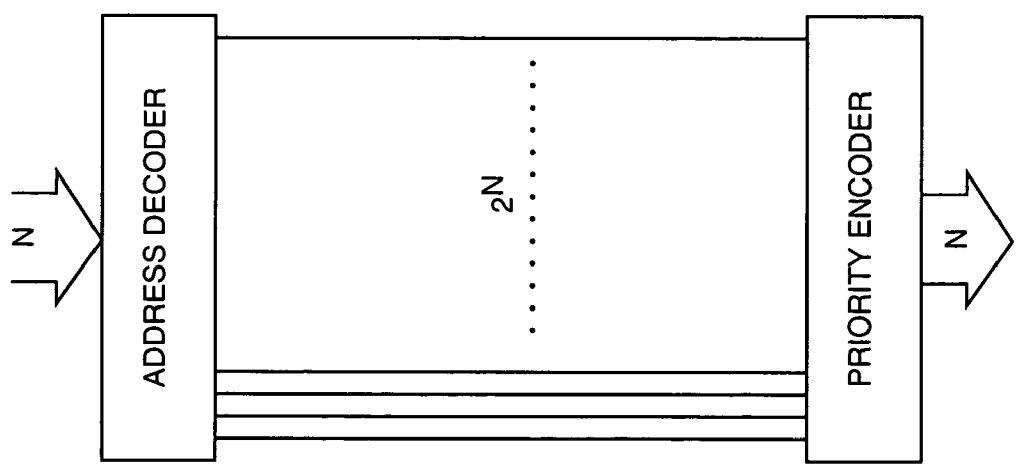

The combination of an address decoder and its inverse, a priority encoder, just reproduces the input, as shown in FIG. 14. If the lines are crossed however, any 1:1 mapping (also known as a Substitution box or S-box, or an information lossless coding) is produced. If some addresses are AND-ORed, implying that some output values are missing, a many: one mapping or information lossy coding is produced. Thus any read only memory having an output word length equal to the address word length can be produced in this way. The information is evidently stored in the address line crisscross or permutation pattern, as that is the only difference between FIGS. 14A and 14B. Using an estimated 4 transistors per line in the address decoder and 6 in the priority encoder shows a saving for memory sizes above 1024 10-bit words. However, using multiple interconnecting layers, several different interconnecting patterns can be produced, all sharing the same priority encoder and address decoder, providing a method of selecting the desired interconnecting pattern. A series pass switch per line, comprised of a P and an N type transistor in parallel as shown in FIG. 13 may be used for this. Thus a number M of interconnecting patterns may be selected and a memory of size $M \cdot 2^N$ N-bit words may be created using 2+10/M transistors per word, showing an increasing efficiency as the number of layers is increased. It is possible that single-transistor pass switches could be used, for example by creating a power supply of $-V_t$ (for a P-type switch) or $V_{cc}+V_t$ (for an N-type switch) to ensure that the switch conducts for both a logic 1 and logic 0 level.

To recap, it has been shown that tables of stored data that represent monotonic functions can be compressed by storing only one base value per group of numerically adjacent values, plus the deltas from the base value for the other values in the group. Alternatively, groups of values may be transformed using a Walsh Transform using a modified Butterfly operation. The limiting case of the latter results in the ability to synthesize any monotonic function with an array of adders with fixed inputs because the memory table has disappeared. An alternative to storing deltas was disclosed to comprise storing the LSB part of the pre-computed result of adding the delta, plus an extra bit to indicate if a carry to the MS part is required, thus eliminating the majority of the reconstruction adders. The technique was extended to piecewise monotonic functions, where the function is monotonic for each compression group. The technique was then extended to random data such as a computer program, by imagining the data to be first sorted in numerical order by permuting the address lines.

When any Delta is zero, it need not be stored, nor an address line generated to address it, thus allowing simplification of the OR-ing of addresses needed for the base word. Analysis of a typical DSP program showed that the majority of the compression could be achieved using this technique alone. Moreover, all possible output values can be produced by a priority encoder using 6 transistors per address line, instead of storing them, which is more efficient when the number of possible output values is greater than 64. Information then resides in the interconnect pattern that connects the address decoder to the priority encoder. Finally, it is shown that a memory can store several random sets of data by employing the vertical dimension to construct several such interconnect patterns, and selecting the desired pattern using pass switches for a reduction in the number of transistors used per word, ultimately to 1 or 2 transistors per word.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

I claim:

1. A method for compressing data for storage in memory, the method comprising:
    forming an ordered set of look-up values by reordering, as necessary, look-up table values in a monotonic order;
    pairing adjacent values in said ordered set to form a plurality of non-overlapping paired values;
    for one or more paired values, generating a difference between said values in said paired values;
    reducing a number of bits required to store the look-up table values by replacing one value in at least one pair of values with the corresponding difference to generate a compressed ordered set; and
    storing the compressed ordered set in said memory.

2. The method of claim 1 wherein modifying said set further comprises maintaining the other of said values in said paired values.

3. The method of claim 2 further comprising iteratively repeating said generating and replacing steps before said storing step.

4. The method of claim 3 wherein one or more of the pairings differ for different iterations.

5. The method of claim 1 wherein said compressed ordered set includes at least one of said look-up table values.

6. The method of claim 1 wherein said generating step comprises generating a difference and a sum of said values in said pair, and wherein the replacing step comprises replacing one of said values in said pair with a value based on said difference and replacing the other of said values in said pair with a value based on said sum.

7. The method of claim 6 further comprising discarding a least significant portion of said sum.

8. The method of claim 6 further comprising iteratively repeating said generating and replacing steps before said storing step.

9. The method of claim 8 wherein the pairing of values differs for different iterations.

10. The method of claim 6 further comprising generating concatenated values by concatenating each said sum and difference from a final iteration that correspond to the paired values of said final iteration, wherein the replacing step comprises replacing said values in said paired values of said final iteration with the corresponding concatenated values.

11. The method of claim 6 further comprising iteratively repeating said generating and replacing steps until one of said sums comprises a summation of all look-up table values in said series and generating a concatenated value by concatenating said sums and differences from the corresponding iteration, wherein the replacing step comprises replacing said values in said paired values from the final iteration with said concatenated value.

12. The method of claim 6 further comprising determining one or more combined values based on a combination of the sum and the difference generated for one or more paired values, wherein replacing one of said values in said paired values with said value based on said difference comprises replacing one of said values in said paired values with a least significant portion of said combined values.

13. The method of claim 1 further comprising reconstructing one or more look-up table values based on the one or more values in said compressed ordered set stored in memory according to a predetermined reconstruction formula.

14. The method of claim 1 wherein the look-up table values comprise values derived from a monotonic function.

15. The method of claim 14 further comprising applying each of said forming, generating, replacing, and storing steps to separate monotonic segments of a piecewise monotonic function.

16. The method of claim 1 wherein the look-up table values comprise non-monotonic values arranged in a monotonic order.

17. The method of claim 16 further comprising disposing said values in said compressed ordered set on a first layer of said memory and accessing one or more of said values in said compressed ordered set via one or more crisscrossed address lines disposed on a second layer of said memory.

18. A method for compressing data for storage in memory, the method comprising:
    forming an ordered set of look-up table values by reordering, as necessary, look-up table values in monotonic order;
    pairing adjacent values in said ordered set to form a plurality of non-overlapping paired values;
    for one or more paired values, generating a difference and a sum of said values in said paired values;
    reducing a number of bits required to store the look-up table values by replacing the values in at least one pair of values with the corresponding sum and difference to generate a compressed ordered set; and
    storing the compressed ordered set in said memory.

19. The method of claim 18 further comprising generating concatenated values by concatenating each said sum and difference for each paired value, wherein the replacing step comprises replacing each said sum and difference with the corresponding concatenated values.

20. The method of claim 18 further comprising iteratively repeating said generating and replacing steps before said storing step.

21. The method of claim 20 further comprising generating concatenated values by concatenating said sums and differences from a final iteration that correspond to the pairings of said final iteration, wherein the replacing step comprises replacing each said sum and difference with the corresponding concatenated value.

22. The method of claim 18 further comprising rounding each sum to a nearest unit to form one or more modified sums, wherein the replacing step comprises replacing the values in at least one pair of values with the corresponding difference and said modified sum.

23. The method of claim 22 further comprising iteratively repeating said generating, rounding, and replacing steps before said storing step, and further comprising generating concatenated values by concatenating said sums and differences, from a final iteration, corresponding to the pairings of said final iteration, and wherein the replacing step comprises replacing each said sum and difference with the corresponding concatenated value.

24. The method of claim 18 further comprising generating a combined value for one or more of said paired values by combining said difference value with said sum value, wherein the replacing step comprises replacing the values in at least one pair of values with values based on said sum value and a least significant portion of said combined value.

25. The method of claim 18 wherein the look-up table values comprise values derived from a monotonic function.

26. The method of claim 25 further comprising applying said forming, generating, and replacing steps to separate monotonic segments of a piecewise monotonic function.

27. The method of claim 18 wherein the look-up table values comprise non-monotonic values arranged in a monotonic order.

28. The method of claim 27 further comprising disposing said values in said compressed ordered set on a first layer of said memory and accessing one or more of said values in said compressed ordered set via one or more crisscrossed address lines disposed on a second layer of said memory.

29. The method of claim 18 further comprising discarding a least significant portion of said sum before said replacing step.

30. A method of compressing data for storage in memory, the method comprising:
    forming an ordered set of look-up table values by reordering, as necessary, look-up table values in a monotonic order, said ordered set including non-overlapping paired values (f0, f1) and (f2, f3);
    generating d0 by determining a difference between f0 and f1, and generating d2 by determining a difference between f2 and f3;
    reducing a number of bits required to store the look-up table values by replacing f1 with d0 and by replacing f3 with d2 to generate a compressed ordered set; and
    storing the compressed ordered set in said memory based on said modified set.

31. The method of claim 30 further comprising, before said storing step:
    pairing values in the compressed ordered set to generate paired values (f0, f2) and (d0, d2);
    generating d1 by determining a difference between f0 and f2, and generating d3 by determining a difference between d0 and d2; and
    replacing f2 with d1 and replacing d2 with d3.

32. The method of claim 30 further comprising generating s0 by determining a sum of f0 and f1, and generating s2 by determining a sum of f2 and f3.

33. The method of claim 32 wherein the replacing step comprises replacing f0 with s0, replacing f1 with d0, replacing f2 with s2, and replacing f3 with d2.

34. The method of claim 33 further comprising:
    generating a first concatenated value by concatenating s0 and d0;
    generating a second concatenated value by concatenating s2 and d2; and
    wherein the replacing step further comprises replacing s0 and d0 with the first concatenated value, and replacing s2 and d2 with the second concatenated value.

35. The method of claim 33 further comprising generating c0 by combining s0 with d0 and generating c2 by combining s2 with d2, wherein the replacing step further comprises replacing f0 with s0, replacing f2 with s2, replacing d0 with a least significant portion of c0, and replacing d2 with a least significant portion of c2.

36. The method of claim 33 further comprising:
    pairing values in the modified set to generate paired values (s0, s2) and (d0, d2);
    generating s1 by determining a sum of s0 and s2 and generating s3 by determining a sum of d0 and d2;
    generating d1 by determining a difference between s0 and s2 and generating d3 by determining a difference between d0 and d2; and
    wherein the replacing step further comprises replacing s0 with s1, replacing s2 with d1, replacing d0 with s3, and replacing d2 with d3.

37. The method of claim 36 further comprising:
    generating a concatenated value by concatenating s1, d1, s3, and d3, wherein the replacing step further comprises replacing s1, d1, s3, and d3 with said concatenated value.

* * * * *